United States Patent
Sasaki

[11] Patent Number: 6,150,676
[45] Date of Patent: Nov. 21, 2000

[54] MOS TYPE IMAGE SENSOR

[75] Inventor: Michio Sasaki, Tokyo, Japan

[73] Assignee: Kabushiki Kaisha Toshiba, Kawasaki, Japan

[21] Appl. No.: 09/266,007

[22] Filed: Mar. 11, 1999

[30] Foreign Application Priority Data

Mar. 31, 1998 [JP] Japan .................................. 10-087613

[51] Int. Cl.[7] ........................ H01L 31/062; H01L 31/113
[52] U.S. Cl. .......................... 257/191; 257/192; 257/443; 257/446; 438/73
[58] Field of Search .................................. 257/443, 291, 257/292, 446; 438/73

[56] References Cited

U.S. PATENT DOCUMENTS 5,986,297  11/1999  Guidash et al. ........................ 257/223
6,051,857   4/2000  Miida ..................................... 257/292
6,072,206   6/2000  Yamashita et al. .................... 257/292

FOREIGN PATENT DOCUMENTS 9-298286  11/1997  Japan .

Primary Examiner—William Mintel
Attorney, Agent, or Firm—Foley & Lardner

[57] ABSTRACT

A MOS type image sensor has an image area that consists of a matrix of pixels and a peripheral circuitry area that drives the image area. To make the MOS type image sensor finer, each of the pixels consists of a second p-well region having a lower impurity concentration than a first p-well region disposed in the peripheral circuitry area; a photodiode having a first main electrode region made of the second p-well region and a second main electrode region formed as a first n-diffusion layer disposed at the surface of the second p-well region; a read transistor having a first main electrode region made of the first n-diffusion layer, a second main electrode region formed as a second n-diffusion layer disposed at the surface of the second p-well region, a gate insulation film disposed on the surface of the second p-well region between the first and second n-diffusion layers, and a gate electrode disposed on the gate insulation film and connected to a read signal line; and an amplification transistor disposed in a third p-well region, having a gate electrode connected to the second main electrode region of the read transistor, a first main electrode region connected to an output signal line, and a second main electrode region. Since the impurity concentration of the second p-well region is low, scaled design rules are employable without causing "white pixels", sensitivity deterioration, signal read voltage increase, or short-channel effect.

27 Claims, 25 Drawing Sheets

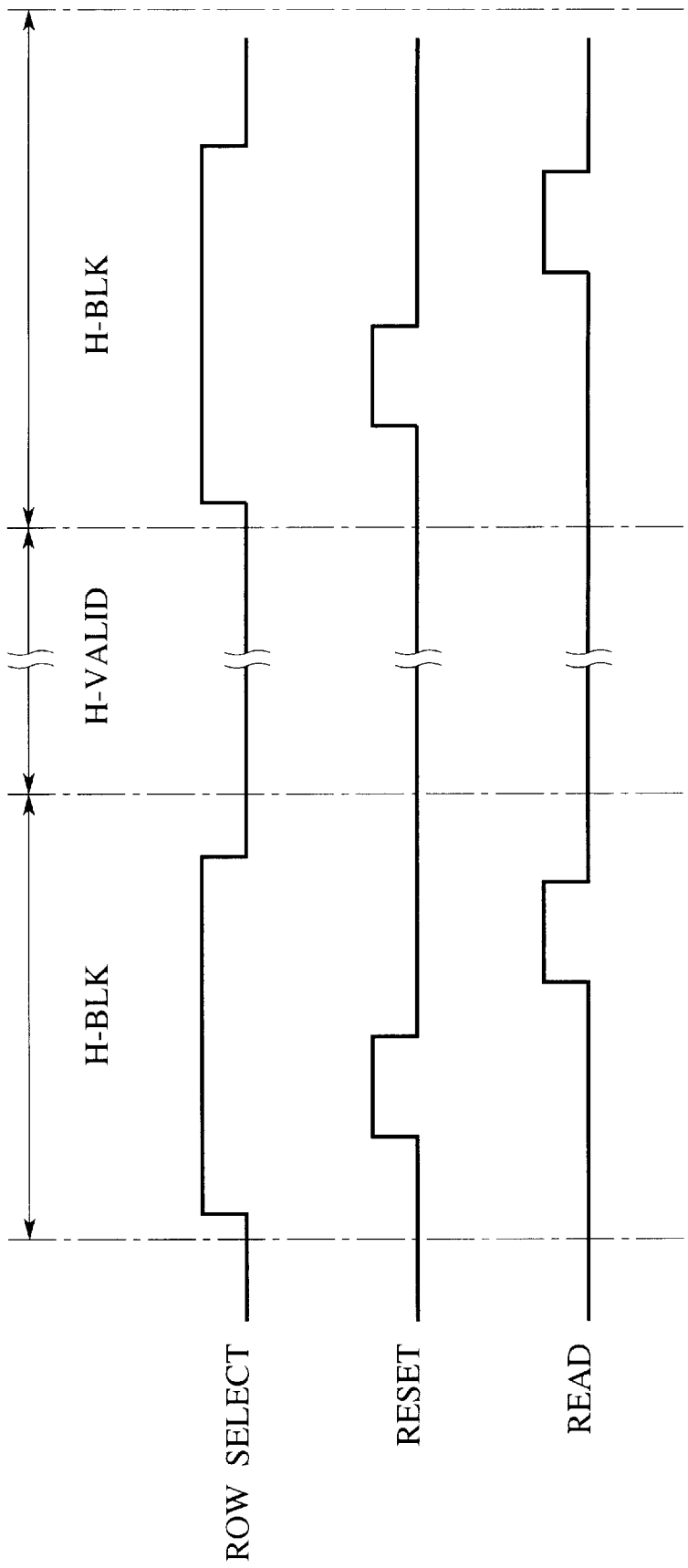

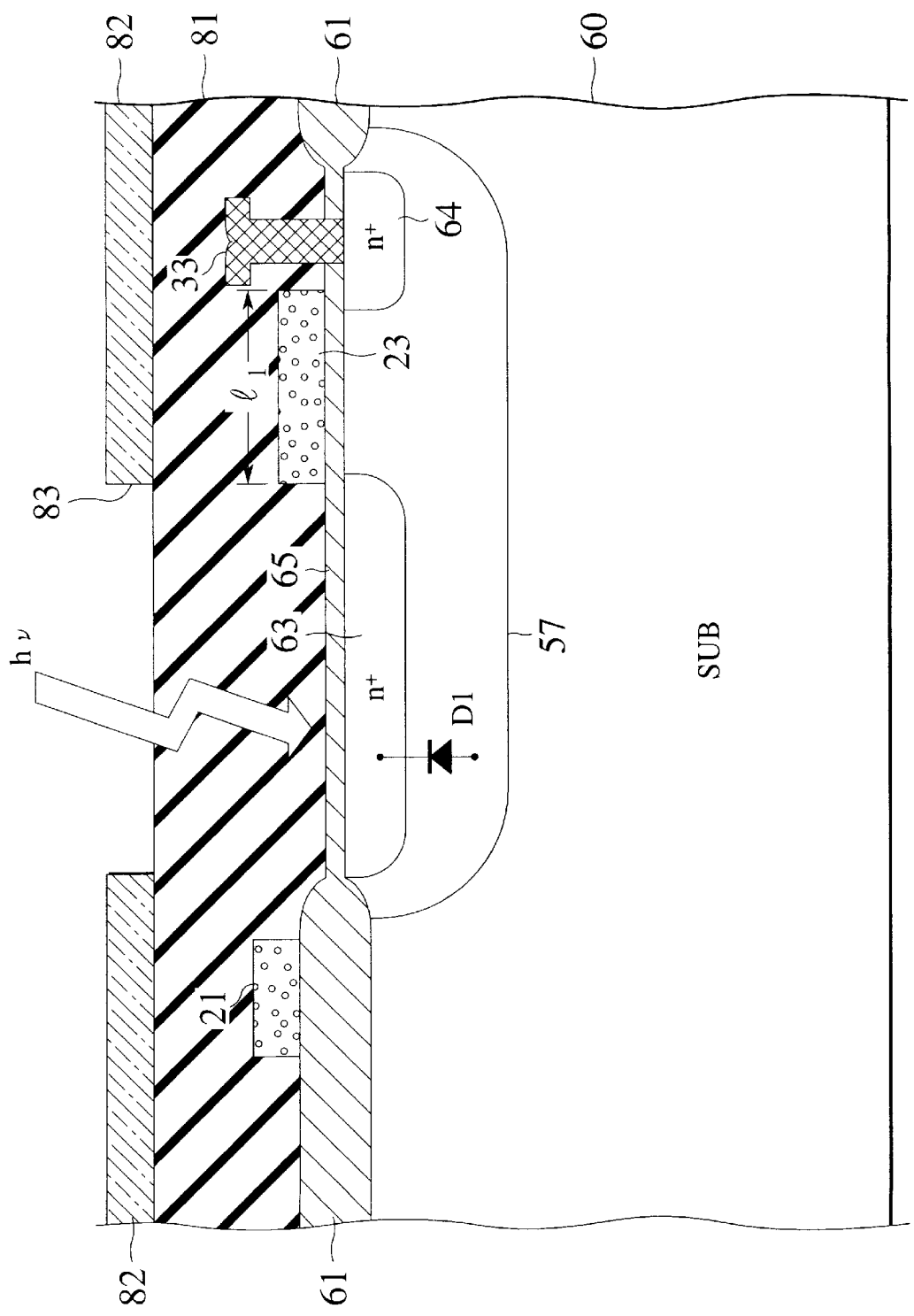

MOS TYPE IMAGE SENSOR

BACKGROUND OF THE INVENTION

1. Field of the Invention

The present invention relates to a solid state image sensor employing an array of pixels, each pixel comprising a photodiode and a plurality of insulated gate transistors such as MOSFETs.

2. Description of the Related Art

There are various solid state image sensors that employ semiconductor devices such as solid state charge-coupled devices (CCDs). The CCD image converters have an interline transfer (IT-CCD), a frame transfer (FT-CCD), charge primitive device (CPD), a photoconductive layer on solid scanner (PLOSS) and other structures. Among them, the interline transfer CCD architecture arranges transfer CCDs between photodiodes.

FIG. 1 shows an example of the interline transfer CCD image sensor according to a prior art. In FIG. 1, photodiodes 103 simultaneously transfer accumulated charge to vertical CCDs (V-CCD) 101-1 to 101-n, which transfer the charge of each line of the photodiodes 103 to a horizontal CCD (H-CCD) 104. The horizontal CCD 104 serially transmits data based on the transferred charge to the outside through an amplifier 105.

This prior art needs a high voltage of about 10 V to read signal charge from the photodiodes 103, as well as power supplies of zero and minus volts to transfer the signal charge. Then the prior art consumes large power and further has a problem that the CCDs are hardly installed on a chip.

To solve the problem, image sensors employing MOSFETs are attracting attention. The MOS type image sensor arranges address lines in a matrix form to select pixels each consisting of a photodiode, MOSFET switching elements, etc.

FIG. 2 shows the structure of a pixel of an image sensor employing the MOSFETs. A photodiode D30 converts light into a photodiode current, which passes through a load transistor Q31. This current is about $10^{-15}$ A to $10^{-9}$ A. Accordingly, the load MOSFET Q31 operates in a weak inversion region, i.e., a sub-threshold mode (Vc <<Vth), and conversion from a photoelectric current into a voltage is dependent on a logarithmic value of a current value. A source voltage of the load MOSFET Q31 is buffered by a source-follower MOSFET Q32. A pixel selection MOSFET Q33 is connected to an activation line 215 and a data read line 216.

When the MOS type image sensor employs miniaturized feature sizes, each MOSFET involves a short gate length to make a short-channel effect conspicuous. This increases a leakage current between the source region and drain region of the load MOSFET Q31, to deteriorate the sensitivity of the pixel.

To suppress a "punch through" phenomenon between the source and drain regions of a MOS transistor in a weak inversion region, Japanese Unexamined Patent Publication No. 9-298286 discloses a technique of extending the gate length of the load MOSFET Q31. This technique, however, contradicts fine element technology and has some limitations.

Namely, this technique maintains the impurity concentration of well regions and extends the gate length of the load MOSFET Q31 by 1.1 times or larger. If finer design rules are employed, the technique must increase the impurity concentration of well regions.

To suppress the punch through phenomenon between the source and drain regions of a MOS transistor in a weak inversion region, the impurity concentration of well regions must be increased. The photodiode D30 for converting light into carriers, however, is formed in the same p-well region where the load MOSFET Q31 is formed.

Namely, an anode region of the photodiode D30 is in the p-well region, and a cathode region thereof is in an n-diffusion layer that is formed in the p-well region. This n-diffusion layer serves as the source/drain region of the load MOSFET Q31. If the impurity concentration of the p-well region is increased, the impurity concentration of the n-diffusion layer must also be increased to maintain a specific I-V characteristics of MOSFET realizing a predetermined saturation signal quantity. This makes a junction electric field steeper to increase so called "white pixels" due to junction leakage currents. In addition, this makes a junction shallower to deteriorate spectral sensitivity in a long wavelength spectrum and increase a signal read voltage.

SUMMARY OF THE INVENTION

An object of the present invention is to provide a MOS type image sensor capable of preventing "white pixels" due to junction leakage currents.

Another object of the present invention is to provide a MOS type image sensor capable of securing spectral sensitivity in a long wavelength spectrum without increasing a signal read voltage.

Still another object of the present invention is to provide a MOS type image sensor capable of reading charge with a low voltage.

Still another object of the present invention is to provide a MOS type image sensor capable of employing scaled MOSFETs while suppressing the short-channel effect.

In order to accomplish the objects, a first aspect of the present invention provides a new structure of a scaled pixel applicable to a MOS type image sensor that consists of an image area and a peripheral circuitry area having a peripheral circuit disposed in a first well region of a first conductivity type for driving the image area. The image area consists of pixels that are arranged linearly or in a matrix. According to the first aspect, each of the pixels consists of at least a second well region of the first conductivity type, having a lower impurity concentration than the first well region; a photodiode having a first main electrode region made of the second well region and a second main electrode region formed as a first diffusion layer of a second conductivity type opposite to the first conductivity type, disposed at a part of the surface of and in the second well region; a read transistor having a first main electrode region made of the first diffusion layer, a second main electrode region formed as a second diffusion layer of the second conductivity type disposed at a part of the surface of and in the second well region, a gate insulation film disposed on the surface of the second well region between the first and second diffusion layers, and a gate electrode disposed on the gate insulation film and connected to a read signal line; and an amplification transistor disposed in a third well region of the first conductivity type, having a gate electrode connected to the second main electrode region of the read transistor, a first main electrode region connected to an output signal line, and a second main electrode region. Here, the "first main electrode region" is one of the anode and cathode regions of a photodiode, or one of the source and drain regions of an insulated gate transistor (IGT) such as a MOSFET and a MOS static induction transistor (SIT). The "second main electrode region" is the other of the anode and cathode regions, or the other of the source and drain regions. For example, if the first main electrode region is the anode region, the second main electrode region is the cathode region, and if the first main electrode region is the source region, the second main electrode region is the drain region. Generally, IGTs are symmetrical, and therefore, the source and drain regions thereof are replaceable with each other. For the IGTs, the source and drain regions are only the matter of naming. The peripheral circuitry area may include another peripheral circuit disposed in another well region of the second conductivity type so as to form the CMOS circuitry for driving the pixels disposed in the image area. Further the peripheral circuitry area may include bipolar transistors (BJTs) so as to form the BiCMOS circuitry for driving the pixels disposed in the image area.

According to the first aspect, the first main electrode region of the photodiode is a semiconductor region of lower impurity concentration. Accordingly, the second main electrode region of the photodiode disposed inside the first main electrode region can be a semiconductor region of lower impurity concentration. Since the photodiode is made of the first and second main electrode regions of lower impurity concentration, it provides higher photoelectric conversion efficiency. Since the first and second main electrode regions of lower impurity concentration form a pn junction, the electric field strength at the pn junction is weakened to reduce junction leakage currents, thereby preventing "white pixels" due to the junction leakage currents and securing spectral sensitivity in a long wavelength spectrum. In addition, the first aspect suppresses an elevation of a signal read voltage and a charge read voltage, thereby reducing the operation voltage and power dissipation of the image sensor.

A second aspect of the present invention provides a MOS type image sensor having pixels. Each pixel consists of at least a photodiode having a first main electrode region formed as a well region of a first conductivity type, a second main electrode region formed as a first diffusion layer of a second conductivity type opposite to the first conductivity type, disposed at a part of the surface of and in the well region; and a semiconductor region that surrounds the first diffusion layer, being sandwiched between the first diffusion layer and the well region, having a lower impurity concentration than the well region; a read transistor having a first main electrode region made of the first diffusion layer, a second main electrode region formed as a second diffusion layer of the second conductivity type disposed at a part of the surface of and in the well region, a gate insulation film disposed on the surface of the well region between the first and second diffusion layers, and a gate electrode disposed on the gate insulation film and connected to a read signal line; and an amplification transistor having a gate electrode connected to the second main electrode region of the read transistor, a first main electrode region connected to an output signal line, and a second main electrode region. Here, the semiconductor region of low impurity concentration surrounding the first diffusion layer may be an intrinsic semiconductor region (an i region), a $\pi$ region, a $p^-$ region, a $\nu$ region, or an $n^-$ region.

The second aspect forms a pin photodiode or an nip photodiode with the second main electrode region of the second conductivity type, the semiconductor region of low impurity concentration surrounding the second main electrode region, and the first main electrode region of the first conductivity type, thereby providing high photoelectric conversion efficiency. The semiconductor region of low impurity concentration such as the i region, $\pi$ region, $p^-$ region, $\nu$ region, or $n^-$ region weakens the electric field strength at an interface between the first and second main electrodes regions, thereby reducing junction leakage currents. This prevents "white pixels" due to the junction leakage currents and secures spectral sensitivity in a long wavelength spectrum. The second aspect suppresses an increment of a signal read voltage as well as a charge read voltage, thereby reducing the operation voltage and power dissipation of the image sensor.

A third aspect of the present invention provides a new structure of a smaller pixel applicable to a MOS type image sensor that consists of an image area and a peripheral circuitry area having a peripheral circuit disposed in a first well region of a first conductivity type for driving the image area. The image area consists of an array of pixels. More precisely, the pixel according to the third aspect consists of at least a second well region of a first conductivity type, having a lower impurity concentration than the first well region; a photodiode having a first main electrode region made of the second well region and a second main electrode region formed as a first diffusion layer of a second conductivity type opposite to the first conductivity type, the first diffusion layer being disposed at a part of the surface of and in the second well region; a read transistor having a first main electrode region made of the first diffusion layer, a second main electrode region formed as a second diffusion layer of the second conductivity type disposed at a part of the surface of and in the second well region, a gate insulation film disposed on the surface of the second well region between the first and second diffusion layers, and a gate electrode disposed on the gate insulation film; an amplification transistor disposed in a third well region of the first conductivity type, having a gate electrode connected to the first main electrode region of the read transistor, a first main electrode region connected to an output signal line, and a second main electrode region; and a row selection transistor disposed in the third well region and having a first main electrode region connected to the second main electrode region of the amplification transistor, a gate electrode connected to an activation signal line, and a second main electrode region connected to a data read signal line.

According to the third aspect, the first main electrode region of the photodiode is a semiconductor region of lower impurity concentration. Accordingly, the second main electrode region disposed in the first main electrode region can be a semiconductor region of lower impurity concentration. Since the photodiode is made of the first and second main electrode regions of lower impurity concentration, it provides high photoelectric conversion efficiency. Since the first and second main electrode regions of low impurity concentration form a pn junction, the electric field strength at the pn junction is weakened to reduce junction leakage currents, thereby preventing "white pixels" due to the junction leakage currents and securing spectral sensitivity in a long wavelength spectrum. In addition, the third aspect suppresses an increase of a signal read voltage and a charge read voltage, thereby reducing the operation voltage and power dissipation of the image sensor.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 8 is a timing chart showing drive pulses to randomly access pixels in the MOS type image sensor of the first embodiment;

FIG. 21 is a sectional view showing an example of the structure of a read MOSFET of FIG. 20A;

DETAILED DESCRIPTION OF THE EMBODIMENTS

Figure 1:
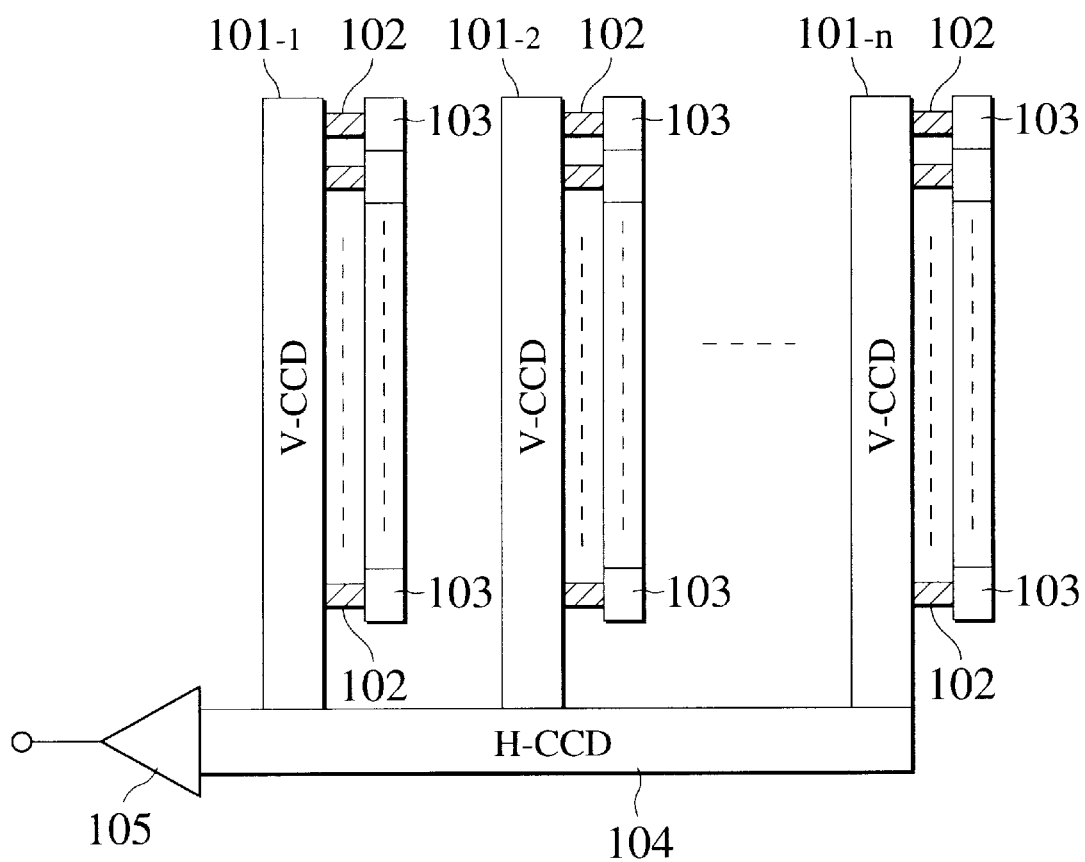
FIG. 1 is a block diagram showing an interline transfer CCD image sensor according to a prior art.
Figure 2:
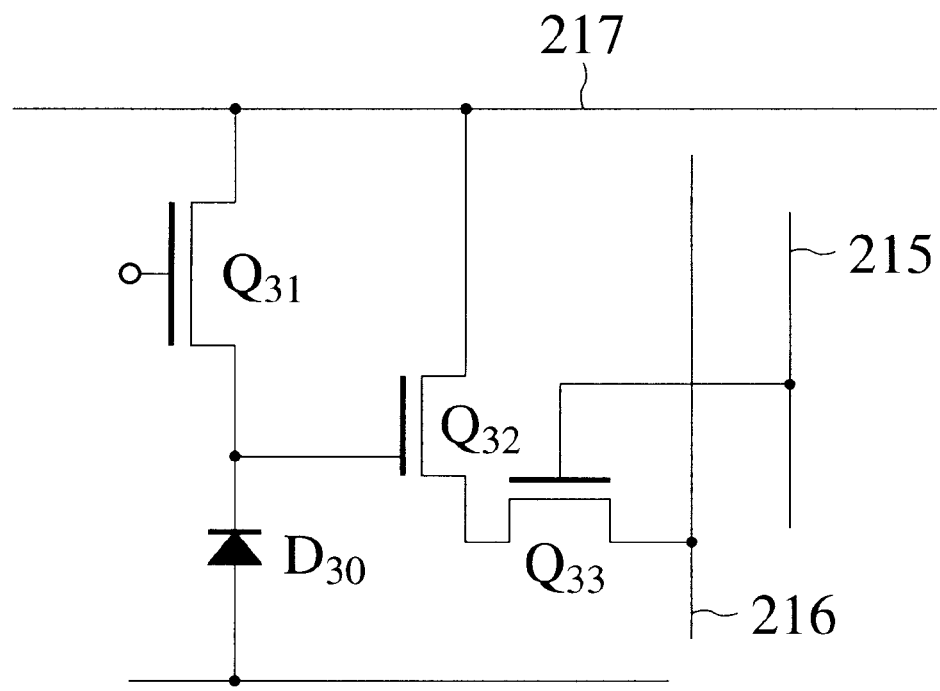
FIG. 2 is a circuit diagram showing an essential part of a MOS type image sensor according to a prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular, that the layer thicknesses are arbitrarily drawn for facilitating the reading of the drawings.

FIRST EMBODIMENT

Figure 3:
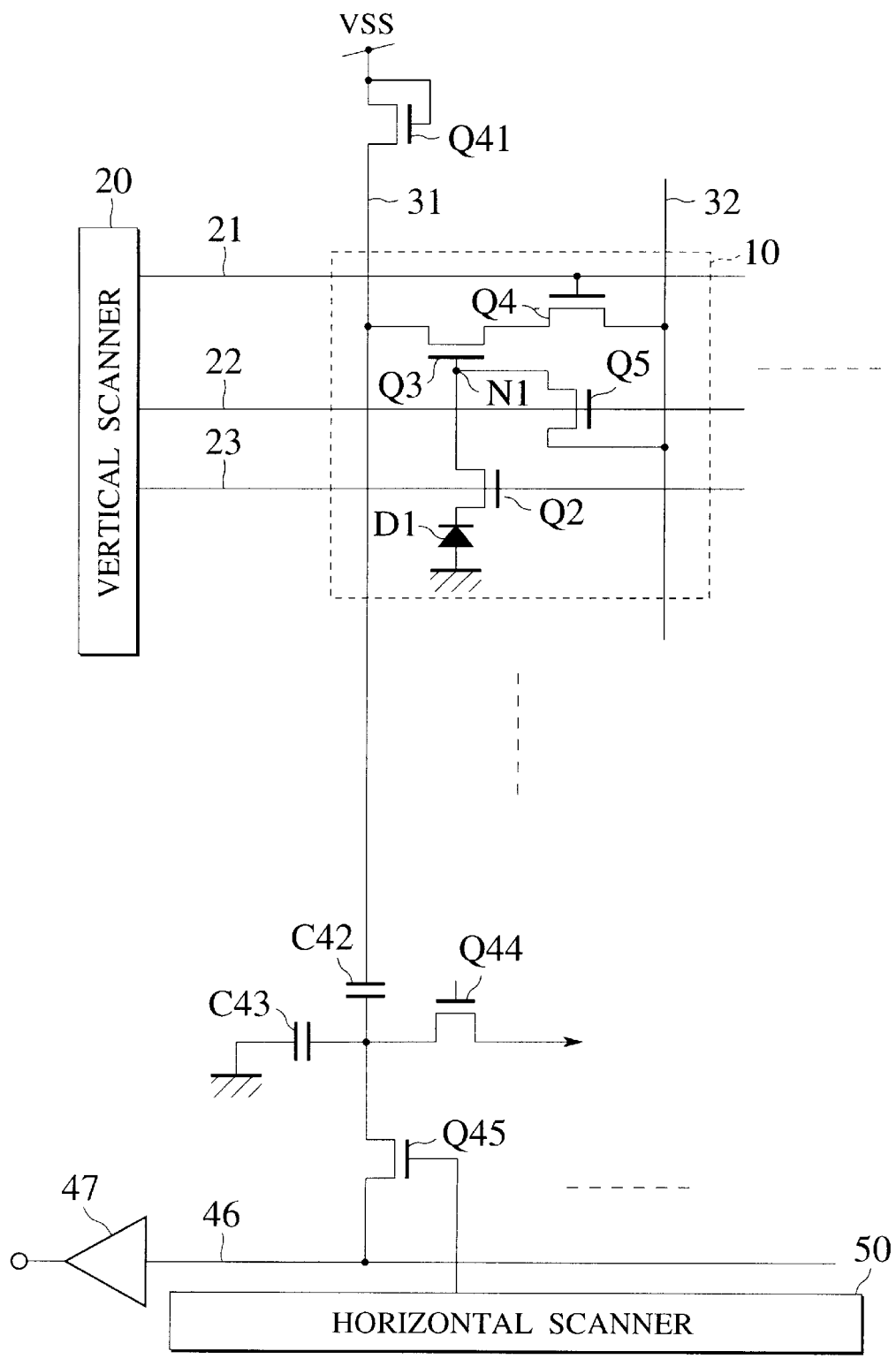
FIG. 3 is a circuit diagram showing an essential part of a MOS type image sensor according to a first embodiment of the present invention.

FIG. 3 is a circuit diagram showing an essential part of a MOS type image sensor according to the first embodiment of the present invention. For the sake of simplicity of explanation, only a line of the MOS type image sensor is shown.

The MOS type image sensor consists of an image area and a peripheral circuitry area for driving the image area. The image area consists of pixels 10 that are arranged in a matrix form. Each of the pixels 10 has a photodiode D1 for converting light into carriers, or electron hole pairs. The photodiode D1 is connected to a read MOSFET Q2 that has a specific structure, being characteristic to the first embodiment. The read MOSFET Q2 serves as a transfer gate to read signal charge from the photodiode D1 and transfer the same to a charge detection node N1. The node N1 is connected to a gate electrode of an amplification MOSFET Q3. The amplification MOSFET Q3 is arranged between and connected to a vertical signal line (output signal line) 31 and a row selection MOSFET Q4. The row selection MOSFET Q4 is arranged between and connected to the amplification MOSFET Q3 and a drain line (power supply line) 32. The row selection MOSFET Q4 is turned on when selected by an address signal that is provided by a vertical scanner 20 through a control signal line 21. A reset MOSFET Q5 is arranged between and connected to the drain line (power supply line) 32 and the node N1. An upper end of the vertical signal line (output signal line) 31 is connected to a supply voltage line VSS through a source follower MOSFET Q41 serving as a constant current source. A lower end of the vertical signal line (output signal line) 31 is connected to a horizontal signal line 46 through a capacitor C42 and a vertical line select MOSFET Q45. A node between the capacitor C42 and the MOSFET Q45 is connected to a capacitor C43 and a signal line clamp MOSFET Q44.

Figure 4:
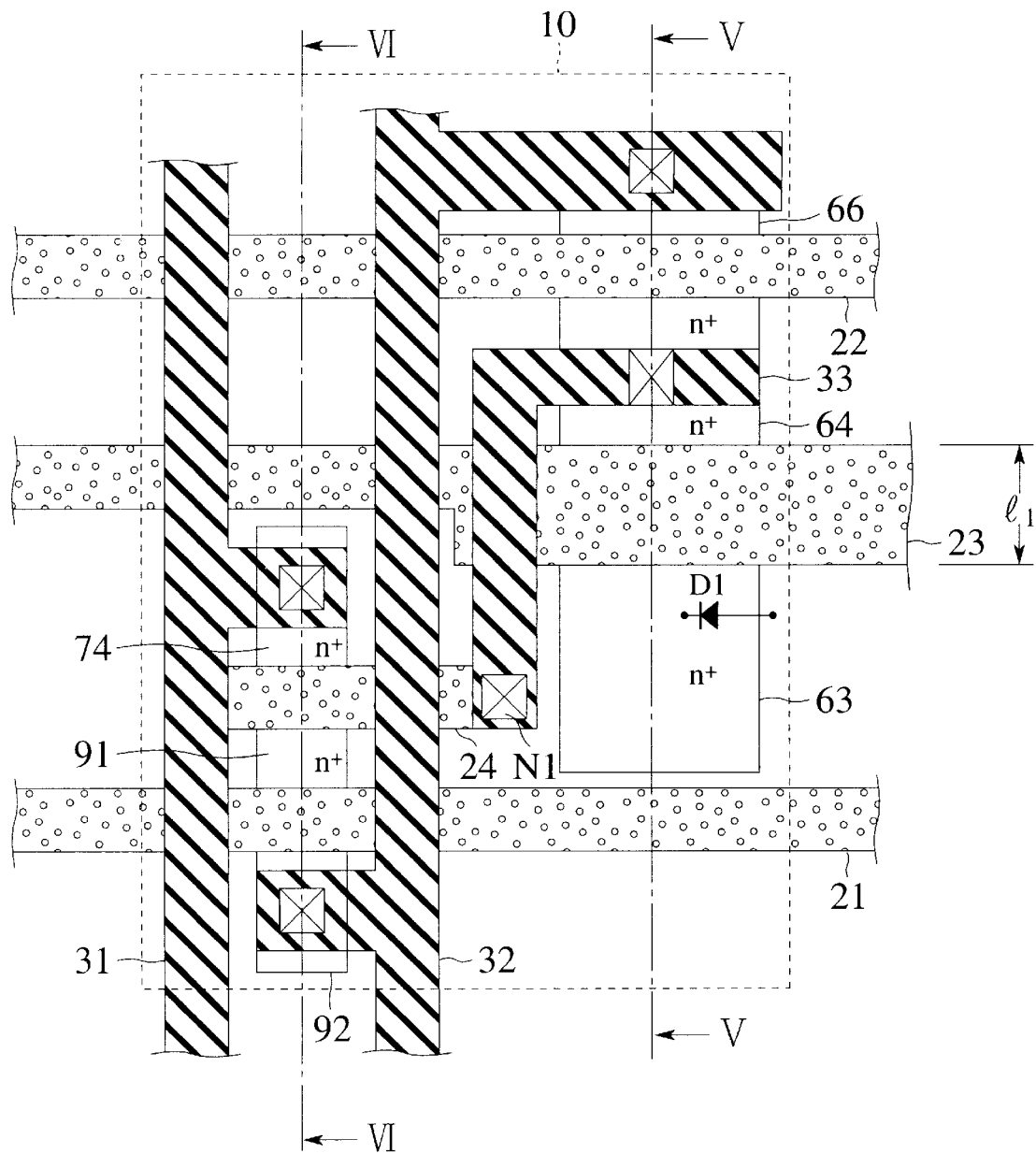
FIG. 4 is a plan view showing an essential part of a pixel of FIG. 3.

FIG. 4 is a plan view showing an essential part of the pixel 13 of FIG. 3. The vertical signal line (output signal line) 31 and drain line (power supply line) 32 run vertically. The lines 31 and 32 are metal wires made of aluminum (Al), aluminum alloy such as Al—Si and Al—Cu—Si, refractory metal such as tungsten (W), titanium (Ti), and molybdenum (Mo), or copper (Cu). Control signal lines 21, 22, and 23, which are doped polysilicon wires, run orthogonally to the lines 31 and 32. The lines 21 to 23 may be made of refractory metal such as W, Ti, and Mo, silicide thereof such as $WSi_2$, $TiSi_2$, and $MoSi_2$, or polycide employing the silicide. The line 21 is a row selection line for transmitting an address (row) selection signal, the line 22 is a reset line for transmitting a reset signal, and the line 23 is a read line for transmitting a read signal.

Figure 5:
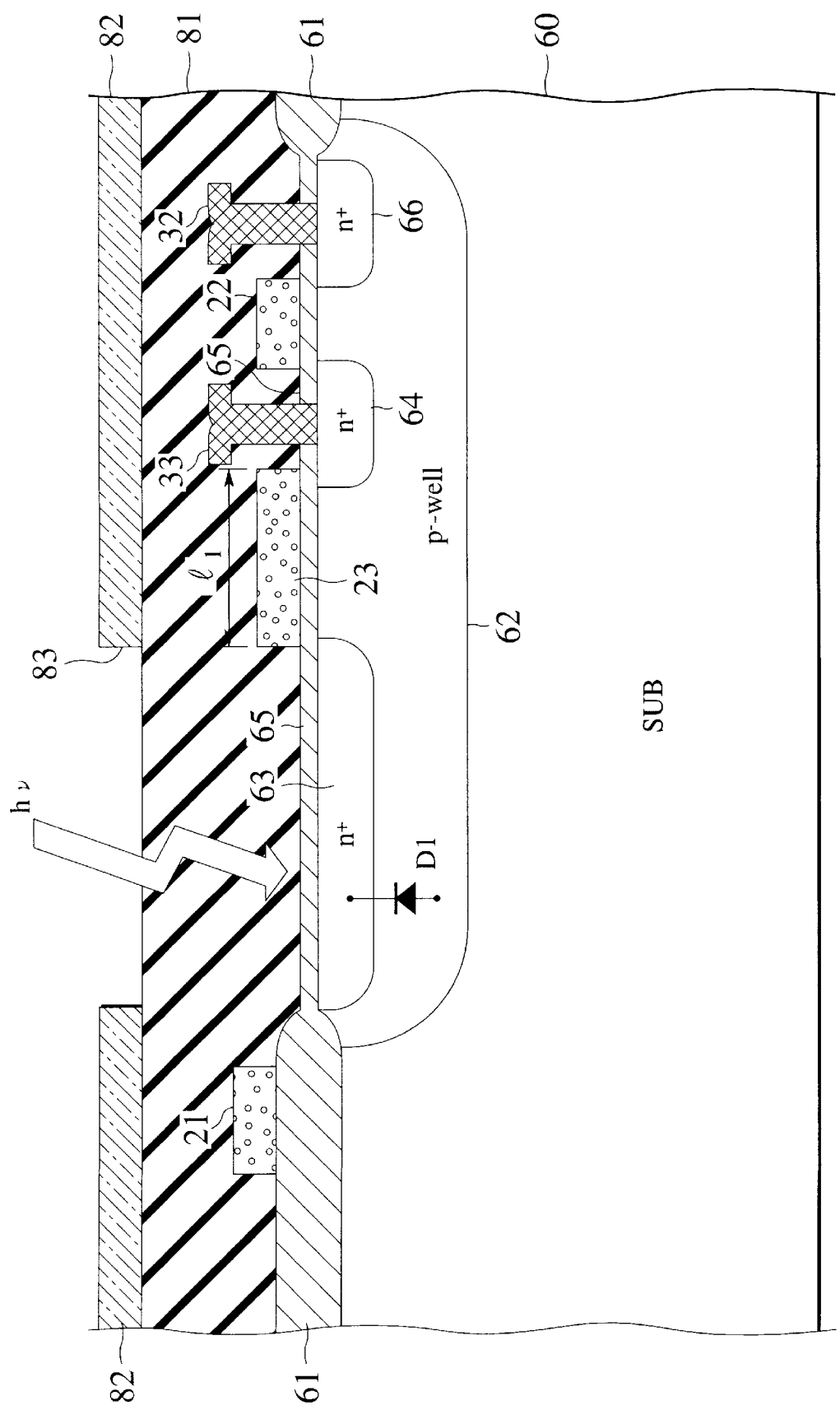
FIG. 5 is a sectional view taken along a line V—V of FIG. 4.

FIG. 5 is a sectional view taken along a line V—V of FIG. 4. A p-substrate 60 has a principal surface on which a field oxide film 61 is formed to isolate an active area from other active areas. At the principal surface of and in the p-substrate 60 disposed in the active area, a p-well region 62 is formed. At a part of the surface of and in the p-well region 62, there is formed a first diffusion layer (n-diffusion layer) 63 to form a second main electrode region (cathode region) of the photodiode D1. The n-diffusion layer 63 also serves as a first main electrode region (source region) of the read MOSFET Q2. At other parts of the surface of the p-well region 62, there are formed a second diffusion layer (n-diffusion layer) 64 serving as a second main electrode region (drain region) of the read MOSFET Q2 as well as a first main electrode region (source region) of the reset MOSFET Q5, and a third diffusion layer (n-diffusion layer) 66 serving as a second main electrode region ((drain region) of the reset MOSFET Q5. The surface of the active area is covered with a gate insulation film 65 on which a control electrode (gate electrode) 23 of the read MOSFET Q2 and a control electrode (gate electrode) 22 of the reset MOSFET Q5 are formed. The electrodes 23 and 22 serve as the signal lines 23 and 22. The n-diffusion layer 64 is connected to a metal wire 33 that extends to the gate electrode (node N1) of the amplification MOSFET Q3 (FIGS. 3 and 4). The metal wire 33 is made of the same material as the vertical signal line (output signal line) 31 and drain line (power supply line) 32, such as aluminum, aluminum alloy, refractory metal, or copper. The n-diffusion layer 66 is connected to the drain line (power supply line) 32. An interlayer insulation film 81 is formed on these elements, and a light shielding film 82 is formed on the insulation film 81. The light shielding film 82 has a light aperture 83 above the photodiode D1 and is made of, for example, an aluminum film of 400 to 800 nm thick.

Figure 6:
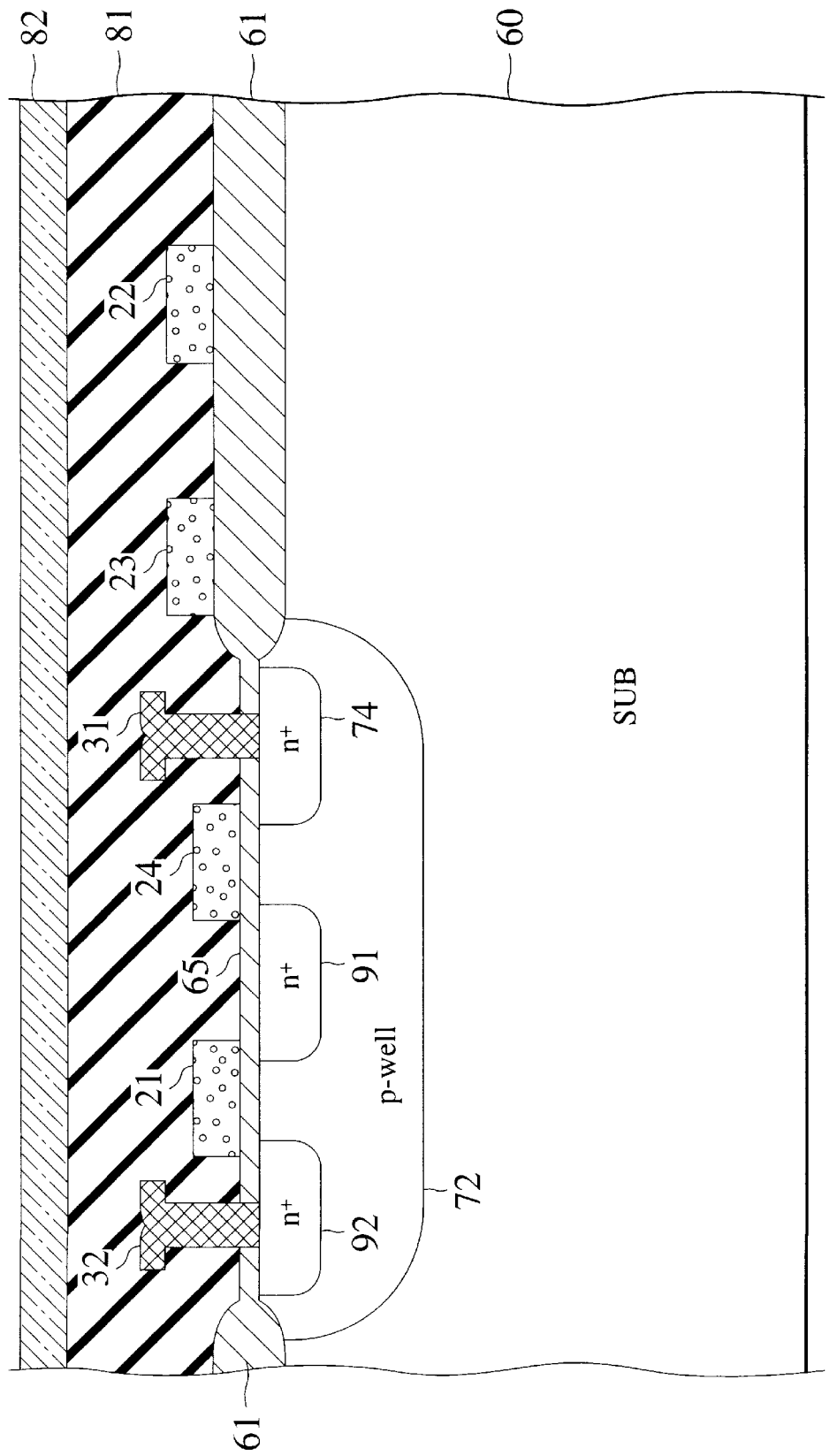
FIG. 6 is a sectional view taken along a line VI—VI of FIG. 4.

FIG. 6 is a sectional view taken along a line VI—VI of FIG. 4. The field oxide film 61 is formed on the principal surface of the p-substrate 60, to define an active area. At the principal surface of and in the p-substrate 60 disposed in the active area, a p-well region 72 is formed. At parts of the surface of and in the p-well region 72, there are formed an n-diffusion layer 92 serving as a second main electrode region (drain region) of the row selection MOSFET Q4 and an n-diffusion layer 91 serving as a first main electrode region (source region) of the same MOSFET Q4. The n-diffusion layer 91 also serves as a second main electrode region drain region) of the amplification MOSFET Q3. At another part of the surface of the p-well region 72, there is formed an n-diffusion layer 74 serving as a first main electrode region (source region) of the amplification MOSFET Q3. The gate insulation film 65 is formed on the surface of the active area, and on the gate insulation film 65, there are formed a control electrode (gate electrode) 21 of the row selection MOSFET Q4 and a control electrode (gate electrode) 24 of the amplification MOSFET Q3. The control electrode 21 serves as the signal line 21. The control electrode 24 is connected to the node N1 (FIGS. 3 and 4), which is connected to the metal wire 33 at the node N1. The metal wire 33 extends from the n-diffusion layer 64 that serves as the second main electrode region (drain region) of the read MOSFET Q2 and the first main electrode region (source region) of the reset MOSFET Q5. The n-diffusion layer 74 is connected to the vertical signal line (output signal line) 31. The interlayer insulation film 81 is formed on these elements, and the light shielding film 82 is formed on the insulation film 81.

Figure 7:
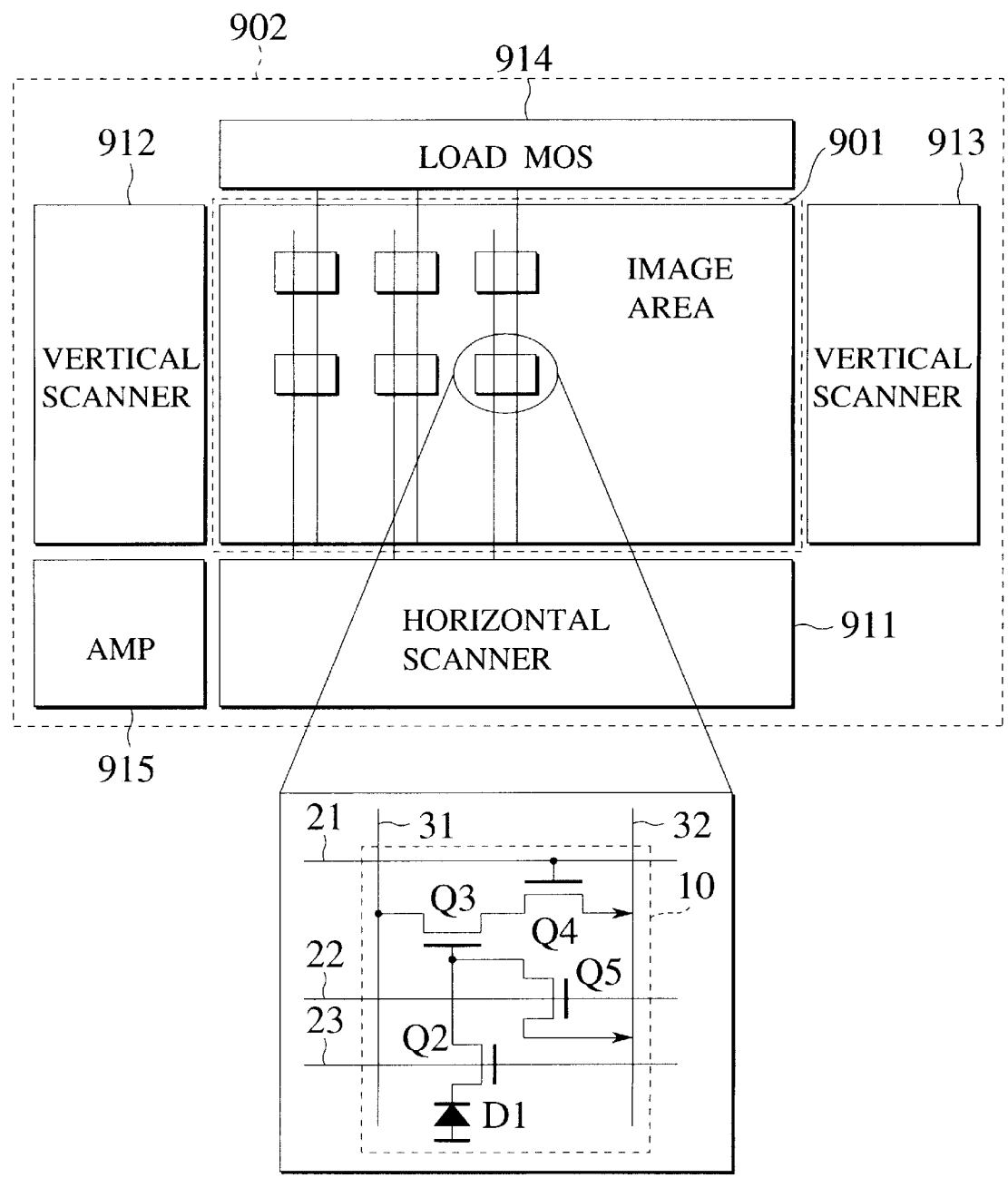
FIG. 7 is a general plan view showing a chip having the MOS type image sensor of the first embodiment.

FIG. 7 is a general plan view showing a chip on which the MOS type image sensor of the first embodiment is formed. An image area 901 has a matrix of pixels 10. A peripheral circuitry area 902 around the image area 901 includes a horizontal scanner 911, vertical scanners 912 and 913, a load MOS 914, and an output amplifier 915. These elements 911 to 915 are made of CMOSs each consisting of n-MOSFETs formed in p-well regions and p-MOSFETs formed in n-well regions. The first embodiment is characterized in that the impurity concentration of the well regions 62 and 72 that form a pixel 10 of the image area 901 is lower than that of p-well regions where the n-MOSFETs of each element of the peripheral circuitry area 902 are arranged. For example, the image area 901 and peripheral circuitry area 902 have MOSFETs each having a gate length $l_0$=0.6 µm. In this case, the p-well regions of the peripheral circuitry area 902 have an impurity concentration of $2\times10^{17}$ $cm^{-3}$ as determined by standard MOSFET design rules. At this time, the impurity concentration of the well regions 62 and 72 in the image area 901 is $1\times10^{17}$ $cm^{-3}$, which is less than half the impurity concentration of the p-well regions of the peripheral circuitry area 902. More precisely, the p-well regions of the peripheral circuitry area 902 are formed by implanting boron ions ($^{11}B^+$) at 150 keV in acceleration energy and $5\times10^{13}$ $cm^{-2}$ in dose. The n-well regions of the peripheral circuitry area 902 are formed by implanting phosphorus ions ($^{31}P^+$) at 150 keV in acceleration energy and $2.9\times10^{13}$ $cm^{-2}$ in dose. On the other hand, the well regions 62 and 72 of the image area 901 are formed by implanting boron ions ($^{11}B^+$) at 150 keV in acceleration energy and $2.5\times10^{13}$ $cm^{-2}$ in dose. Thereafter, the substrate is heat-treated for 150 minutes in an atmosphere of nitrogen ($N_2$), to form the p-well regions and n-well regions.

FIG. 8 is a timing chart showing drive pulses to randomly access the pixels of the MOS type image sensor of the first, embodiment. With reference to this chart, the operation of the MOS type image sensor of the first embodiment of FIG. 3 will be explained.

(a) The vertical scanner 20 selects the control signal line 21, and the level of the line 21 becomes "high". The line 21 applies a row selection pulse to the gate of each row selection MOSFET Q4 connected to the line 21, thereby turning on the row selection MOSFETs Q4.

(b) The vertical scanner 20 sets the control signal line 22 to "high" level to provide a reset signal (pulse). The reset signal periodically turns on the reset MOSFET Q5, to thereby periodically initialize the potential of the node N1.

(c) After the reset signal becomes "low" level, the control signal line 23 is activated to "high" level. As a result, a read pulse is applied to the gate electrode of the read MOSFET Q2 connected to the control signal line 23, to turn on the MOSFET Q2. Due to photoelectric conversion, signal charge accumulated in the photodiode D1 is transferred to the node N1. The potential of the node N1 controls a drain current of the amplification MOSFET Q3. Namely, the quantity of a current flowing from the drain line (power supply line) 32 to the vertical signal line (output signal line) 31 through the row selection MOSFET Q4 and amplification MOSFET Q3 is controlled by the potential of the node N1. As a result, the signal charge accumulated by the photodiode D1 is amplified by the amplification MOSFET Q3 and is transferred to the vertical signal line (output signal line) 31.

(d) Thereafter, the read pulse and row selection pulse are turned off to "low" level, and a horizontal valid period starts. During the horizontal valid period, the potential of each of the gate electrodes of the MOSFETs Q2, Q3, and Q4 is "low" level, and therefore, the photodiode D1 accumulates electrons due to photoelectric conversion.

(e) The charge transferred to the vertical signal line (output signal line) 31 is accumulated by the capacitor C43, and a change in the potential of the capacitor C43 is transferred to the horizontal signal line 46 through the MOSFET Q45. The horizontal scanner 50 sequentially turns on and off the MOSFETs Q45, so that the charge of each line is transmitted to the outside through the amplifier 47.

(f) After the horizontal valid period, the next line is selected, the row selection pulse, reset pulse, and read pulse are successively changed to "high" level, and signal charge accumulated in the photodiode D1 of the next pixel is amplified and read.

In this way, signal charge accumulated in the photodiode D1 of each pixel in the image area 901 is randomly accessed, to obtain a two-dimensional image.

Figure 9A:
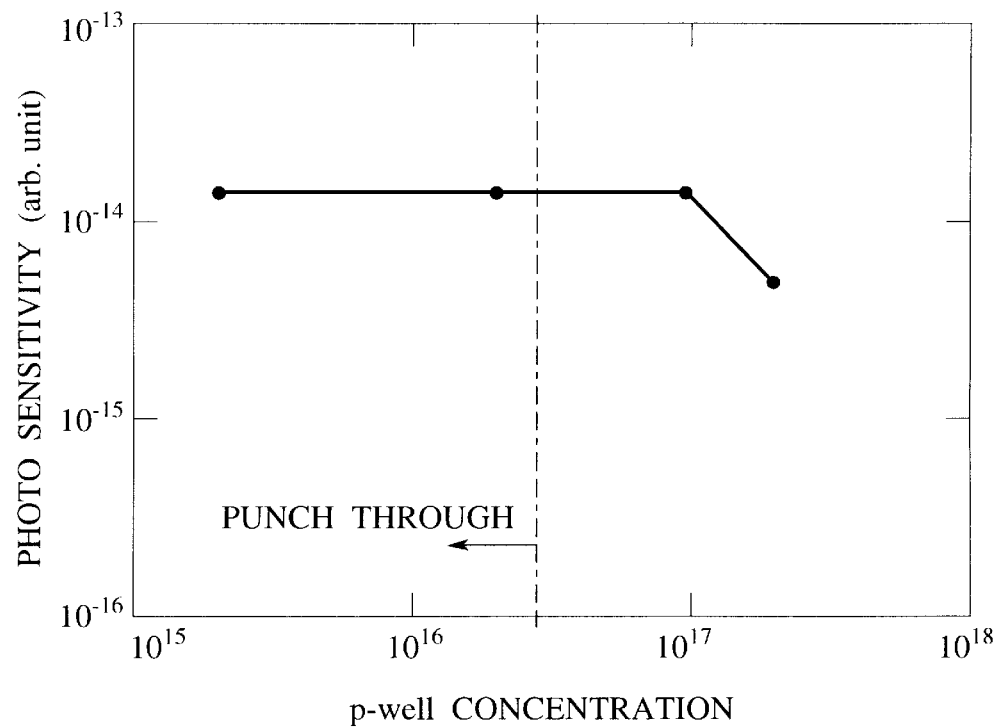
FIG. 9A is a graph showing a relationship between the carrier concentration of a p-well region in a pixel and the photo sensitivity.

FIG. 9A is a graph showing a relationship between the carrier concentration of the p-well region 62 in the pixel 10 and the photo sensitivity. It is understood from the graph that the heavier the doping levels of the p-well region 62 than $1 \times 10^{17}$ cm$^{-3}$, the drastically lower the photosensitivity. The effect of the increase of the photo sensitivity due to the lessening of the doping levels of the p-well region 62 approximately saturated with the carrier concentration less than $1 \times 10^{17}$ cm$^{-3}$. On the other hand, the punch through phenomena becomes significant with the carrier concentration less than $2 \times 10^{16}$ cm$^{-3}$. Accordingly, the carrier concentration of the p-well region 62 in the pixel 10 according to the first embodiment is selected to be about $1 \times 10^{17}$ cm$^{-3}$.

Figure 9B:
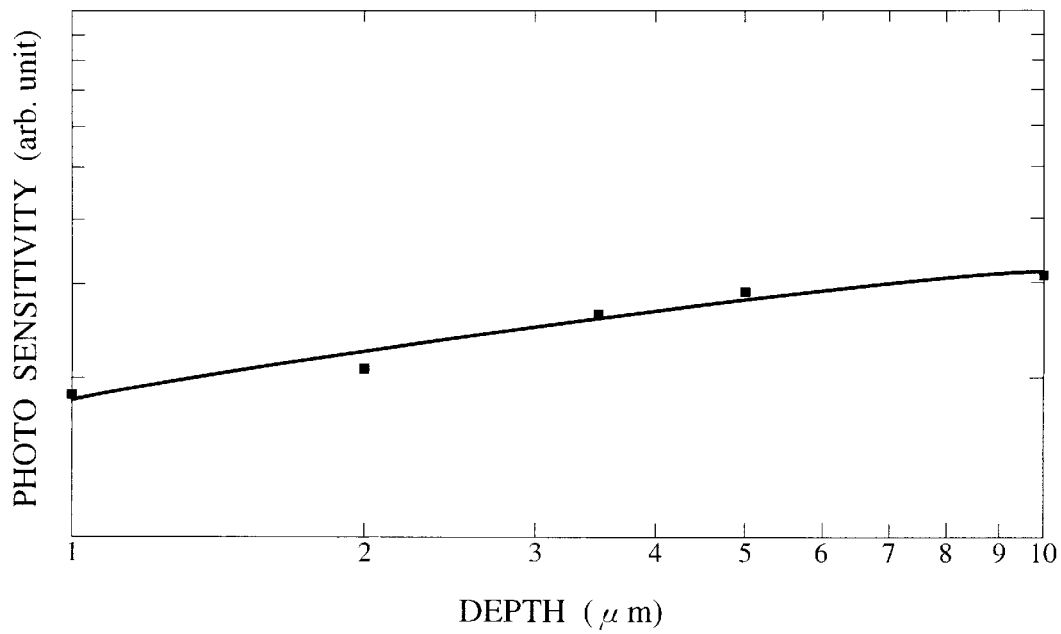
FIG. 9B is a graph showing a relationship between the junction depth of the p-well region in the pixel and the sensitivity of the pixel of the first embodiment with the impurity concentration of the p-well region being $1 \times 10^{17}$ cm$^{-3}$.

FIG. 9B is a graph showing a relationship between the junction depth of the p-well region 62 in the pixel 10 and the photo sensitivity of the pixel 10 of the first embodiment with the impurity concentration of the p-well region being $1 \times 10^{17}$ cm$^{-3}$. It is understood from the graph that the deeper the junction depth of the p-well region 62, the better the sensitivity of the pixel. However, the effect of the depth weakens as it becomes deeper. Accordingly, the junction depth of the p-well region 62 according to the first embodiment is selected to be about 6 μm. This is because no significant improvement is observed even if the junction depth of the p-well region 62 is deepened further than 6 μm. To deepen the junction depth of the p-well region 62, it is necessary to extend the duration of a heat treatment, which frequently worsens variations among pixels, and therefore, is not preferable.

To the anode region (p-well region) 62 of the photodiode D1 of $1 \times 10^{17}$ cm$^{-3}$ in impurity concentration and about 6 μm in junction depth, phosphorus ($^{31}$P$^+$) ions are implanted at, for example, 300 keV in acceleration energy and $8 \times 10^{15}$ cm$^{-2}$ in dose, to form the cathode region (n-diffusion layer) 63 of the photodiode D1.

In this way, the first embodiment provides the following technical advantages when employing fine MOSFETs for the MOS type image sensor:

(1) preventing "white pixels" due to junction leakage currents;

(2) improving sensitivity to light and securing spectral sensitivity in a long wavelength spectrum; and (3) lowering a signal read voltage.

Among the read MOSFET Q2, amplification MOSFET Q3, row selection MOSFET Q4, and reset MOSFET Q5, a leakage current flowing between the source and drain regions of the read MOSFET Q2 most influences the characteristics of the pixel. A leakage current flowing between the source and drain regions of each of the other MOSFETs has a relatively large allowance. To suppress a punch-through current flowing between the source and drain regions of the read MOSFET Q2, the first embodiment makes the gate length $l_1$ of the control electrode 23 of the read MOSFET Q2 larger than the gate length $l_0$ of any one of the other MOSFETs, as shown in FIGS. 4 and 5. For example, the gate length $l_1$ is set to be 1.6–2 μm against the gate length $l_0$ of 0.6 μm, reducing the leakage currents to be less than ¼ of the MOSFET having the gate length $l_0$ of 0.6 μm. This secures good pixel characteristics even if the impurity concentration of the well regions 62 and 72 of each pixel 10 is made lower than that of the p-well regions of the peripheral circuits 911 to 915.

SECOND EMBODIMENT

Figure 10:
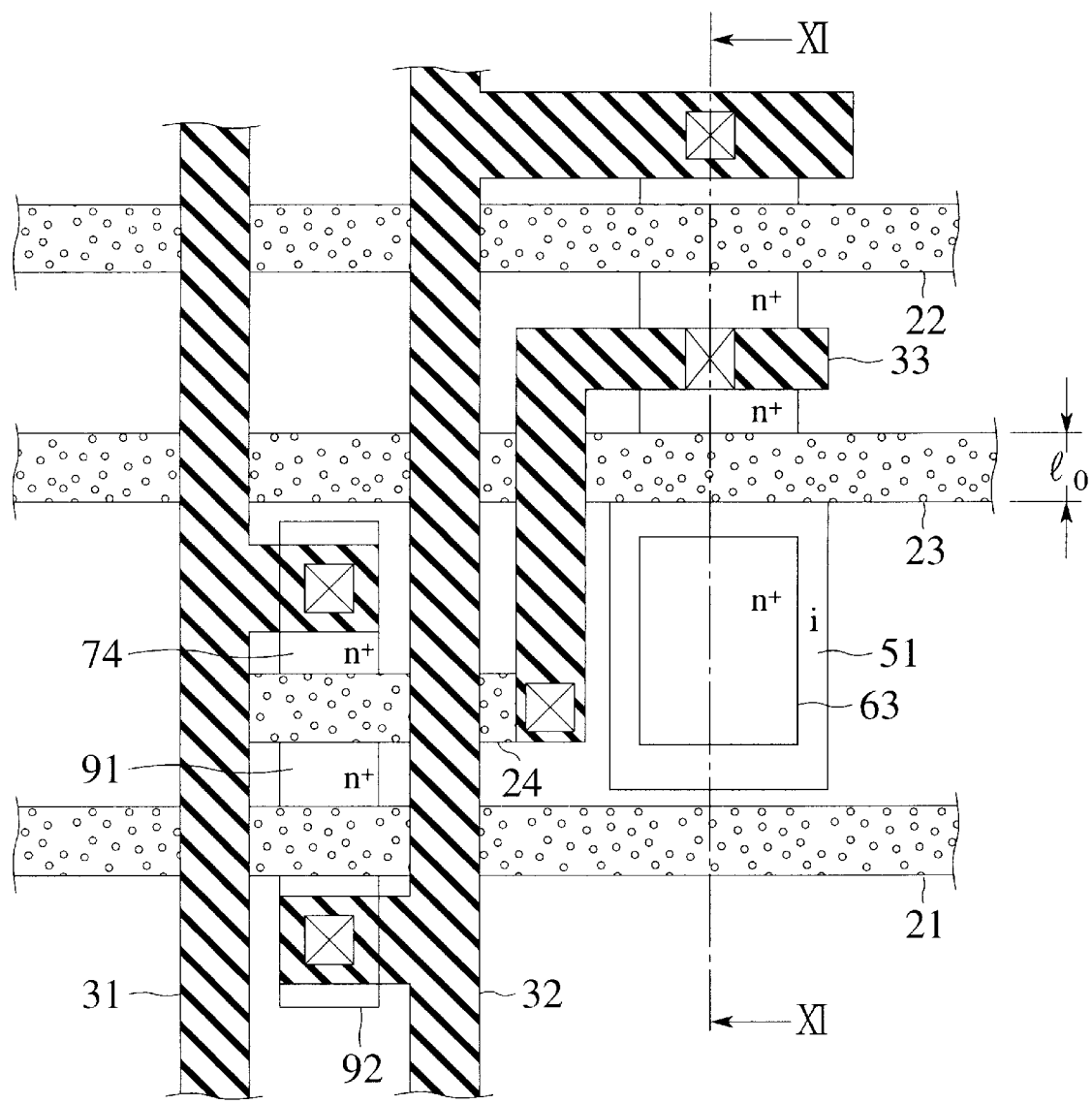
FIG. 10 is a plan view showing an essential part of a pixel of a MOS type image sensor according to a second embodiment of the present invention.

FIG. 10 is a plan view showing an essential part of a pixel of a MOS type image sensor according to a second embodiment of the present invention. A circuit diagram of this embodiment is the same as FIG. 3.

In each pixel of the MOS type image sensor of the second embodiment, a vertical signal line (output signal line) 31 and a drain line (power supply line) 32 run vertically. These lines 31 and 32 are made of metal wires. Control signal lines 21, 22, and 23 run orthogonally to the lines 31 and 32. The lines 21 to 23 are made of doped polysilicon wires. The lines 21 to 23 may be made of refractory metal such as W, Ti, and Mo, or silicide thereof such as WSi$_2$, TiSi$_2$, and MoSi$_2$, or polycide employing the silicide. The line 23 is a read line for transmitting a read signal, the line 22 is a reset line for transmitting a reset signal, and the line 21 is a row selection line for transmitting an address (row) selection signal. Unlike the arrangement of FIG. 4, the read line 23 has the same line width $l_0$ as that of the lines 21 and 22.

Figure 11:
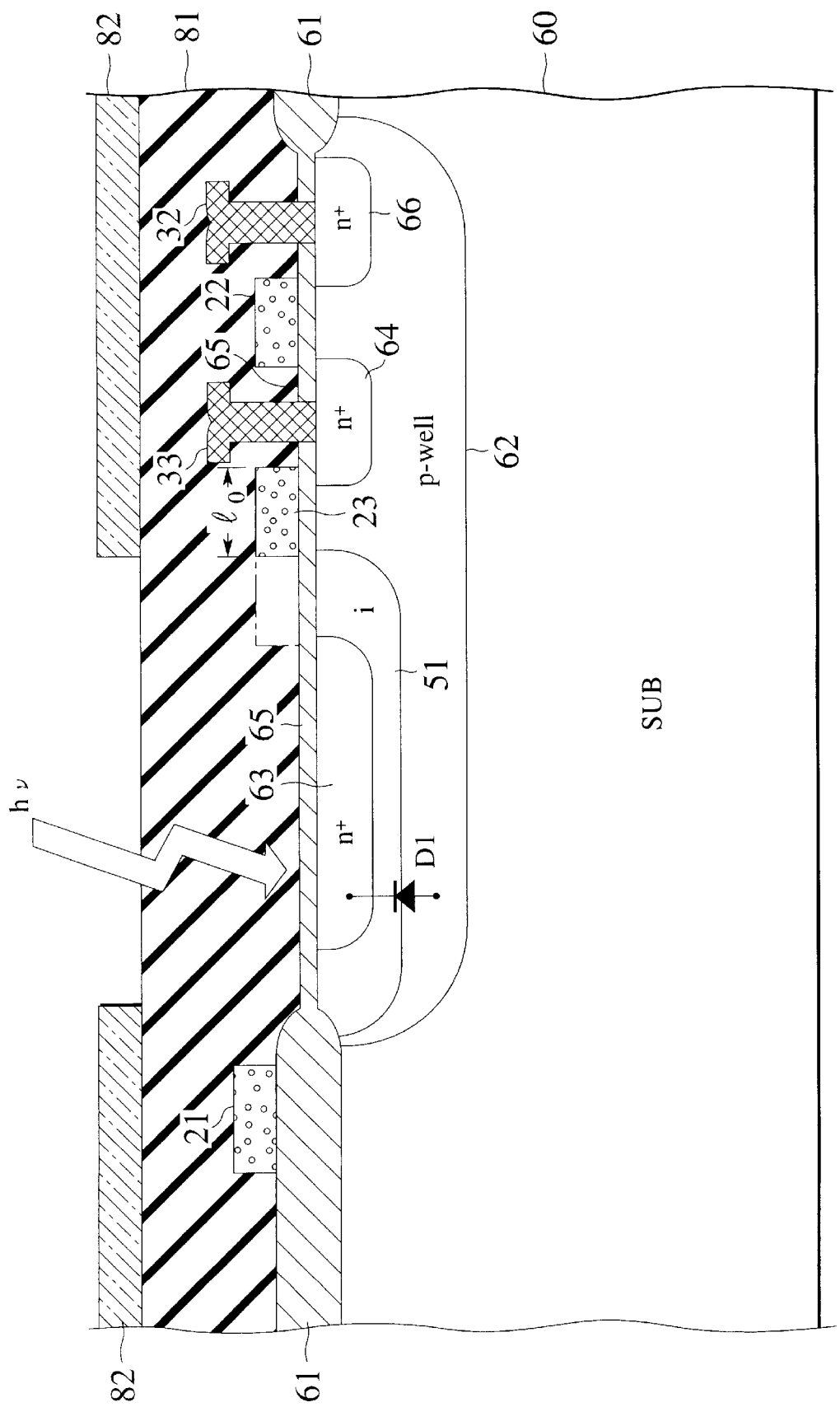
FIG. 11 is a sectional view taken along a line XI—XI of FIG. 10.

FIG. 11 is a sectional view taken along a line XI—XI of FIG. 10. A p-substrate 60 has a principal surface on which a field oxide film 61 is formed to isolate an active area from other active areas. At the upper principal surface of and in the p-substrate 60 disposed in the active area, a p-well region 62 is formed. At a part of the surface of and in the p-well region 62, there is formed an intrinsic semiconductor region 51. The region 51 contains and adjoins a first diffusion layer (n-diffusion layer) 63 serving as a second main electrode region (cathode region) of a photodiode D1. Namely, the n-diffusion layer 63, intrinsic semiconductor region 51, and p-well region 62 form the nip photodiode D1. The intrinsic semiconductor region 51 is completely depleted by diffusion potential. The n-diffusion layer 63 also serves as a first main electrode region (source region) of a read MOSFET Q2. At other parts of the surface of and in the p-well region 62, there are formed a second diffusion layer (n-diffusion layer) 64 serving as a second main electrode region (drain region) of the read MOSFET Q2 as well as a first main electrode region (source region) of a reset MOSFET Q5, and a third diffusion layer (n-diffusion layer) 66 serving as a second main electrode region (drain region) of the reset MOSFET Q5. The surface of the active area is covered with a gate insulation film 65 on which a control electrode (gate electrode) 23 of the read MOSFET Q2 having a gate length of $l_0$ and a control electrode (gate electrode) 22 of the reset MOSFET Q5 having the same gate length of $l_0$ are formed. In this way, the second embodiment made it possible to delineate all FETs for peripheral circuits and an image area with the same gate length of $l_0$.

The intrinsic semiconductor region 51 is always depleted, and therefore, carriers drift in the region 51 by electric field between the source and drain regions. By locally arranging the control electrode (gate electrode) 23, having the gate length of $l_0$, in the vicinity of the drain region 64 of the read MOSFET Q2 as shown in FIG. 11 and by making the potential of the gate electrode 23 "high" level, the potential barrier height for electrons, disposed just under the gate electrode 23, decreases. As a result, carriers (electrons) drifted by the electric field to the potential barrier can surmount the barrier, and are injected into the second diffusion layer (n-diffusion layer) 64. When the potential of the gate electrode 23 is changed to "low" level, the potential barrier height for electrons just under the gate electrode 23 increases. As a result, carriers (electrons) drifted to the potential barrier can not surmount the barrier, and are stopped from being injected into the second diffusion layer (n-diffusion layer) 64. In this way, controlling the potential of the gate electrode 23 changes the potential barrier height just under the gate electrode 23 to turn on and off the read MOSFET Q2 effectively.

The electrodes 23 and 22 serve as the signal lines 23 and 22. The n-diffusion layer 64 is connected to a metal wire 33 (FIG. 10) that extends to a gate electrode (node N1) of an amplification MOSFET Q3. The metal wire 33 is made of the same material as the vertical signal line (output signal line) 31 and drain line (power supply line) 32, such as aluminum, aluminum alloy, refractory metal, or copper. The n-diffusion layer 66 is connected to the drain line (power supply line) 32. An interlayer insulation film 81 is formed on these elements, and a light shielding film 82 is formed on the insulation film 81. The light shielding film 82 has a light aperture 83 above the photodiode D1 and is made of, for example, an aluminum film of 400 to 800 nm thick.

Sectional views of the row selection MOSFET Q4 and amplification MOSFET Q3 are the same as those of FIG. 6.

The structure of a chip that materializes the MOS type image sensor of the second embodiment is the same as that of FIG. 7. Namely, an image area 901 has a matrix of pixels 10, each pixel 10 having the read MOSFET Q2 and the reset MOSFET Q5 shown in FIG. 11. A peripheral circuitry area 902 around the image area 901 includes a horizontal scanner 911, vertical scanners 912 and 913, a load MOS 914, and an output amplifier 915.

The second embodiment can equalizes the impurity concentration of p-well regions in the image area 901 with the impurity concentration of p-well regions where n-MOSFETs of the peripheral circuitry area 902 are formed, thereby simplifying manufacturing processes. For example, the second embodiment employs design rules with a gate length $l_0=0.6$ $\mu$m and an impurity concentration of $2\times10^{17}$ cm$^{-3}$ for the p-well regions of the image area 901 and peripheral circuitry area 902. The second embodiment is characterized in that the p-well regions of the image area 901 and peripheral circuitry area 902 have an identical impurity concentration and that only the circumambience of the cathode region 63 of the photodiode D1 is the intrinsic semiconductor region 51 whose impurity concentration is far lower than that of the p-well regions of the peripheral circuitry area 902.

If an increase in the number of processes is allowed, the impurity concentration of the p-well regions of the image area 901 may be made lower than that of the p-well regions of the peripheral circuitry area 902 with the perimeter of the cathode region 63 of the photodiode D1 being the intrinsic semiconductor region 51.

Forming only the surrounding of the cathode region 63 with the intrinsic semiconductor region 51 having low impurity concentration, to form the nip photodiode D1 greatly improves light sensitivity even if finer and finer MOSFETs are used. In particular, this technique improves spectral sensitivity in a long wavelength spectrum, prevents "white pixels" due to junction leakage currents, and lowers a signal read voltage.

Figure 12:
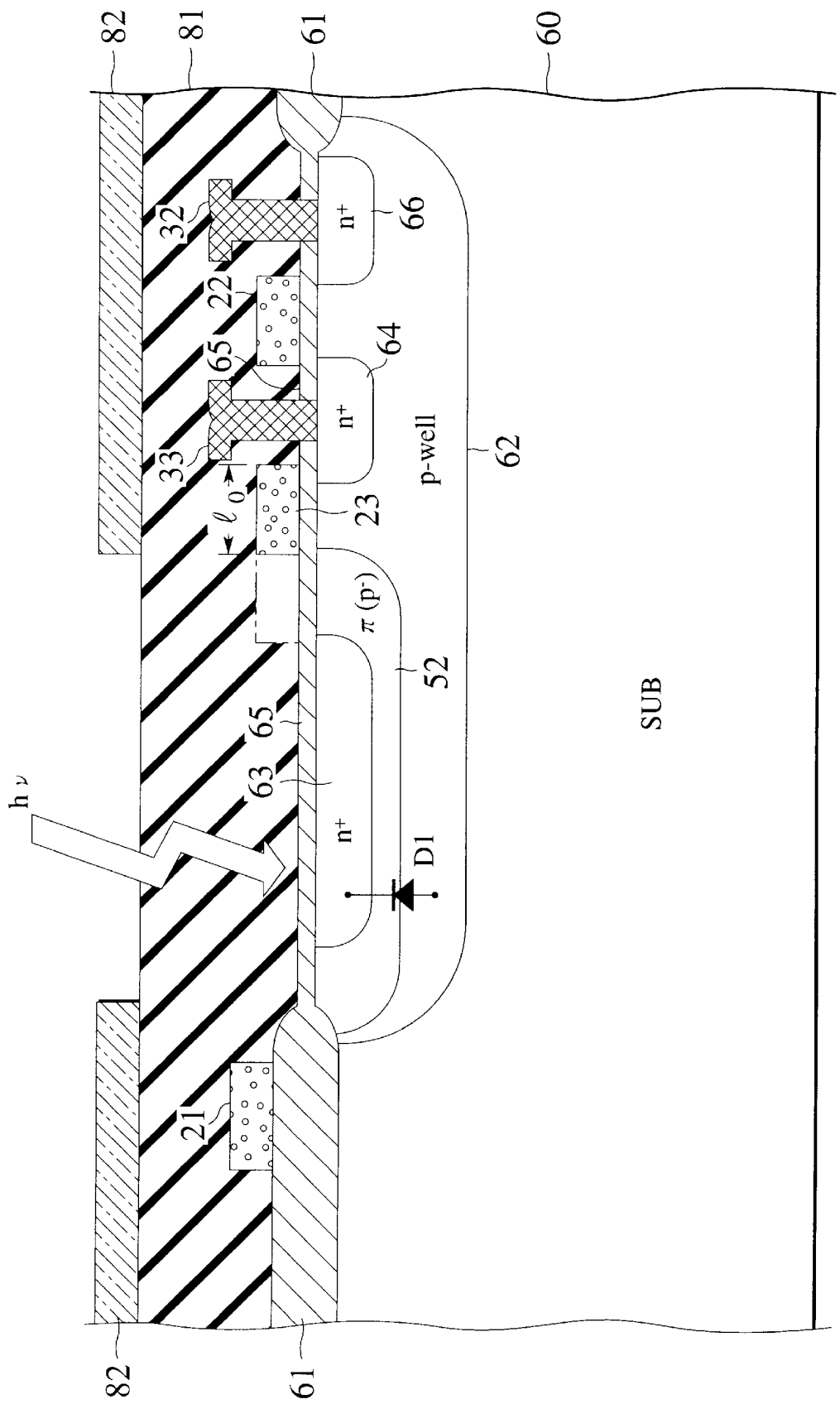
FIG. 12 is a sectional view showing an essential part of a pixel of a MOS type image sensor according to a modification of the second embodiment.
Figure 13:
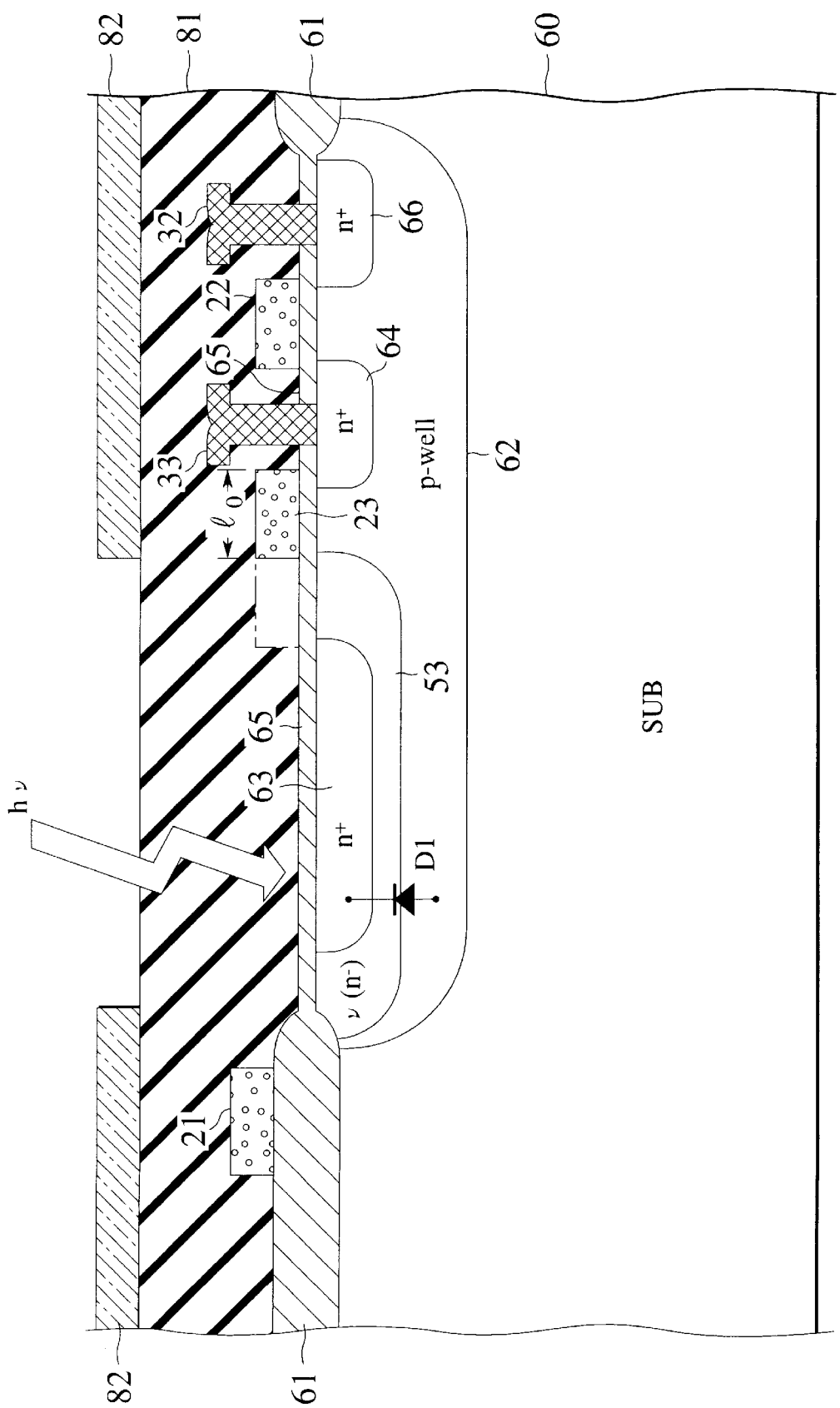
FIG. 13 is a sectional view showing an essential part of a pixel of a MOS type image sensor according to another modification of the second embodiment.

The surrounding of the cathode region 63 of the photodiode D1 is not necessarily the intrinsic semiconductor region 51. Namely, in silicon (Si), it is not necessarily a region of $1.5\times10^{10}$ cm$^{-3}$ at room temperature. As shown in FIG. 12, it may be a $\pi$ region (or a p$^-$ region) 52, or as shown in FIG. 13, a $\nu$ region (or an n$^-$ region) 53. Namely, the impurity concentration of the circumjacence of the cathode region 63 of the photodiode D1 may be in the range of $1\times10^{12}$ cm$^{-3}$ to $1\times10^{16}$ cm$^{-3}$. A maximum of the impurity concentration of the circumjacence of the cathode region 63 of the photodiode D1 may be about ½ of the impurity concentration of the p-well regions of the peripheral circuitry area 902.

THIRD EMBODIMENT

Figure 14:
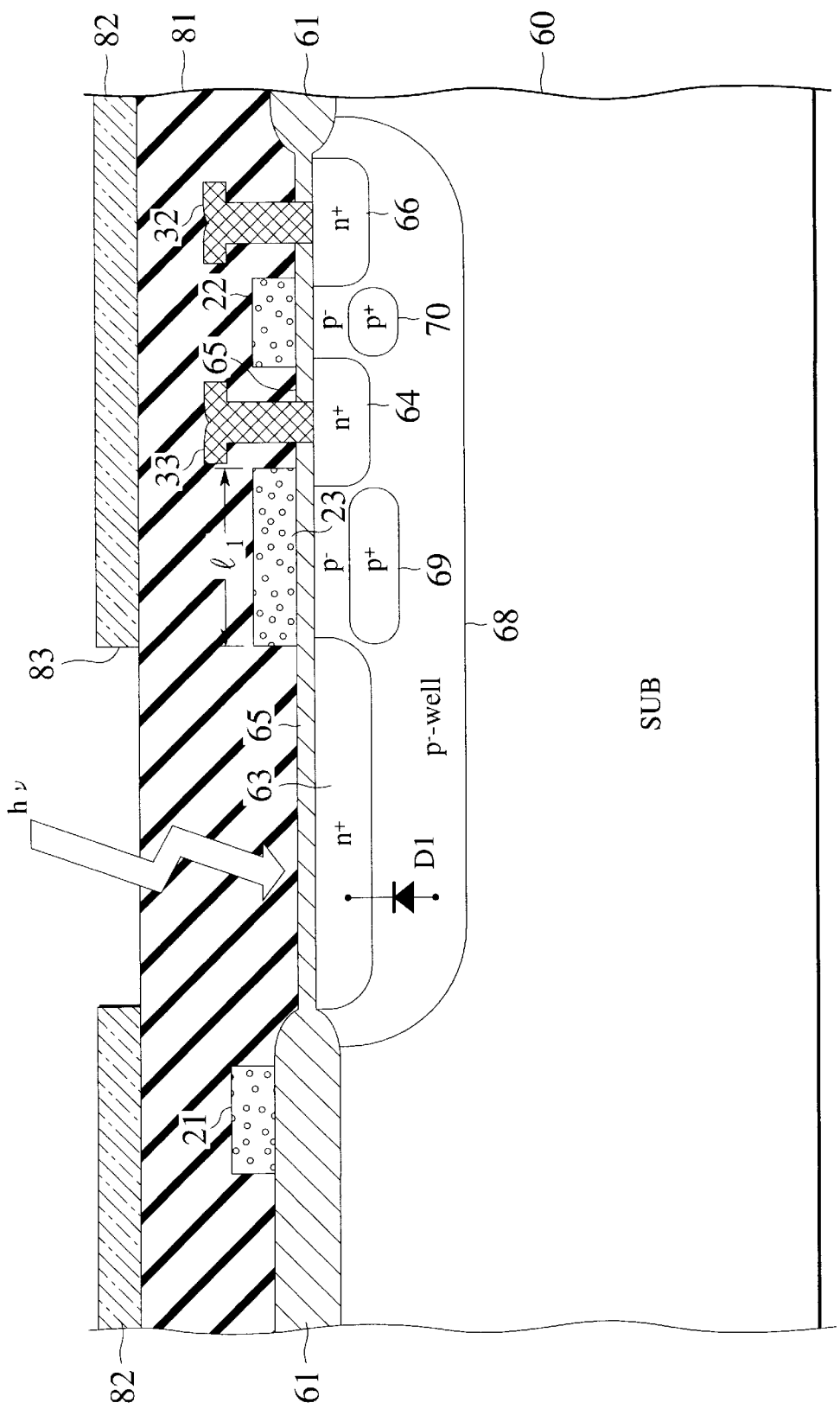
FIG. 14 is a sectional view showing a read MOSFET and reset MOSFET of a MOS type image sensor according to a third embodiment of the present invention.

FIG. 14 is a sectional view showing a read MOSFET Q2 and reset MOSFET Q5 of a MOS type image sensor according to a third embodiment of the present invention. A circuit diagram of an essential part of the MOS type image sensor of the third embodiment is the same as FIG. 3, and a plan view thereof is the same as FIGS. 4 and 10. The MOS type image sensor of the third embodiment will be explained on assumptions that design rules with gate length $l_0=0.6$ $\mu$m are used, MOSFETs are formed in an image area and peripheral circuitry area, and the impurity concentration of p-well regions of the peripheral circuitry area is $2\times10^{17}$ cm$^{-3}$.

The sectional view of FIG. 14 corresponds to one taken along the line V—V of FIG. 4 or the line XI—XI of FIG. 10. At a principal surface of a p-substrate 60, a field oxide film 61 is disposed to isolate an active area from other active areas. At the principal surface of and in the p-substrate 60 disposed in the active area, a p$^-$-well region 68 of $2\times10^{16}$ cm$^{-3}$ to $1\times10^{17}$ cm$^{-3}$ in impurity concentration is formed. At a part of the surface of the p$^-$-well region 68, there is formed a first diffusion layer (n-diffusion layer) 63 serving as a second main electrode region (cathode region) of a photodiode D1. Namely, the n-diffusion layer 63 and p$^-$-well region 68 form the pn (p$^-$n) photodiode D1.

The n-diffusion layer 63 also serves as a first main electrode region (source region) of a read MOSFET Q2. At other parts of the surface of the p$^-$-well region 68, there are formed a second diffusion layer (n-diffusion layer) 64 serving as a second main electrode region (drain region) of the read MOSFET Q2 as well as a first main electrode region (source region) of a reset MOSFET Q5, and a third diffusion layer (n-diffusion layer) 66 serving as a second main electrode region (drain region) of the reset MOSFET Q5. Between the first and second main electrode regions (source and drain regions) of the read MOSFET Q2, there is formed a p$^+$-buried region 69 of $2\times10^{18}$ cm$^{-3}$ to $8\times10^{19}$ cm$^{-3}$ in impurity concentration. Between the second main electrode region (drain region) 66 of the reset MOSFET Q5 and the first main electrode region (source region) 64 thereof, there is formed a p$^+$-buried region 70 of $2\times10^{18}$ cm$^{-3}$ to $8\times10^{19}$ cm$^{-3}$ in impurity concentration.

The surface of the active area is covered with a gate insulation film 65 on which a control electrode (gate electrode) 23 of the read MOSFET Q2 having the gate length of $l_1$ and a control electrode (gate electrode) 22 of the reset MOSFET Q5 having the gate length of $l_0$ are formed. Just under the control electrode (gate electrode) 23 of the read MOSFET Q2, there is the top layer of the p⁻-well region 68 serving as a channel region, and under which, there is the p⁺-buried region 69. As a result, built-in potential due to the p⁻-well region 68 and p⁺-buried region 69 increases a potential barrier height for electrons in the channel region just under the gate electrode 23, thereby providing "a normally OFF" characteristic. Due to the p⁺-buried region 69, a sub-threshold current between the source and drain regions of the read MOSFET Q2 is minimized to an ignorable value. Similarly, a potential barrier height for electrons in a channel region just under the gate electrode 22 of the reset MOSFET Q5 increases to effectively control the flow of carriers, minimizing a sub-threshold current of the reset MOSFET Q5 to an ignorable value.

The electrodes 23 and 22 serve as signal lines 23 and 22. The n-diffusion layer 64 is connected to a metal wire 33 (FIG. 10) that extends to a gate electrode (node N1) of an amplification MOSFET Q3. The n-diffusion layer 66 is connected to a drain line (power supply line) 32. An interlayer insulation film 81 is formed on these elements, and a light shielding film 82 is formed on the insulation film 81. The light shielding film 82 has a light aperture 83 above the photodiode D1.

Although not shown, between the source and drain regions of a row selection MOSFET Q4 and those of the amplification MOSFET Q3, there are similar p+-buried regions. The p⁺-buried regions are not required if the impurity concentration of the p-well region for forming the row selection MOSFET Q4 and amplification MOSFET Q3 is equalized with the impurity concentration of $2\times10^{17}$ cm⁻³ of the p-well regions of the peripheral circuitry area.

In this way, the third embodiment lowers the impurity concentration of the neighboring area of the cathode region 63 to form the pn (p⁻n) photodiode D1, to greatly improve light sensitivity even if scaled MOSFETs are used. In particular, this technique improves spectral sensitivity in a long wavelength spectrum, prevents "white pixels" due to junction leakage currents, and lowers a signal read voltage.

Figure 15:
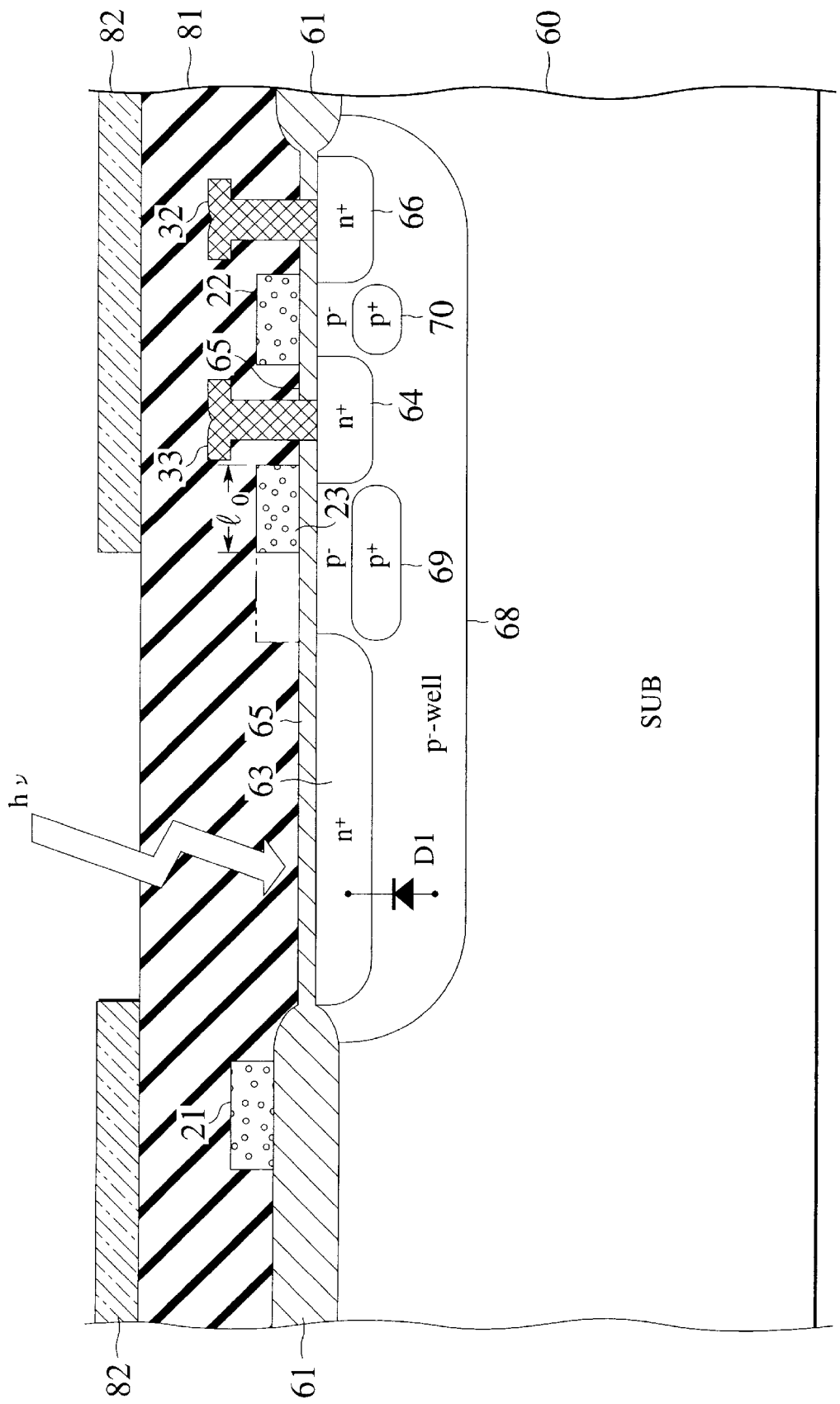
FIG. 15 is a sectional view showing an essential part of a pixel of a MOS type image sensor according to a modification of the third embodiment.
Figure 16:
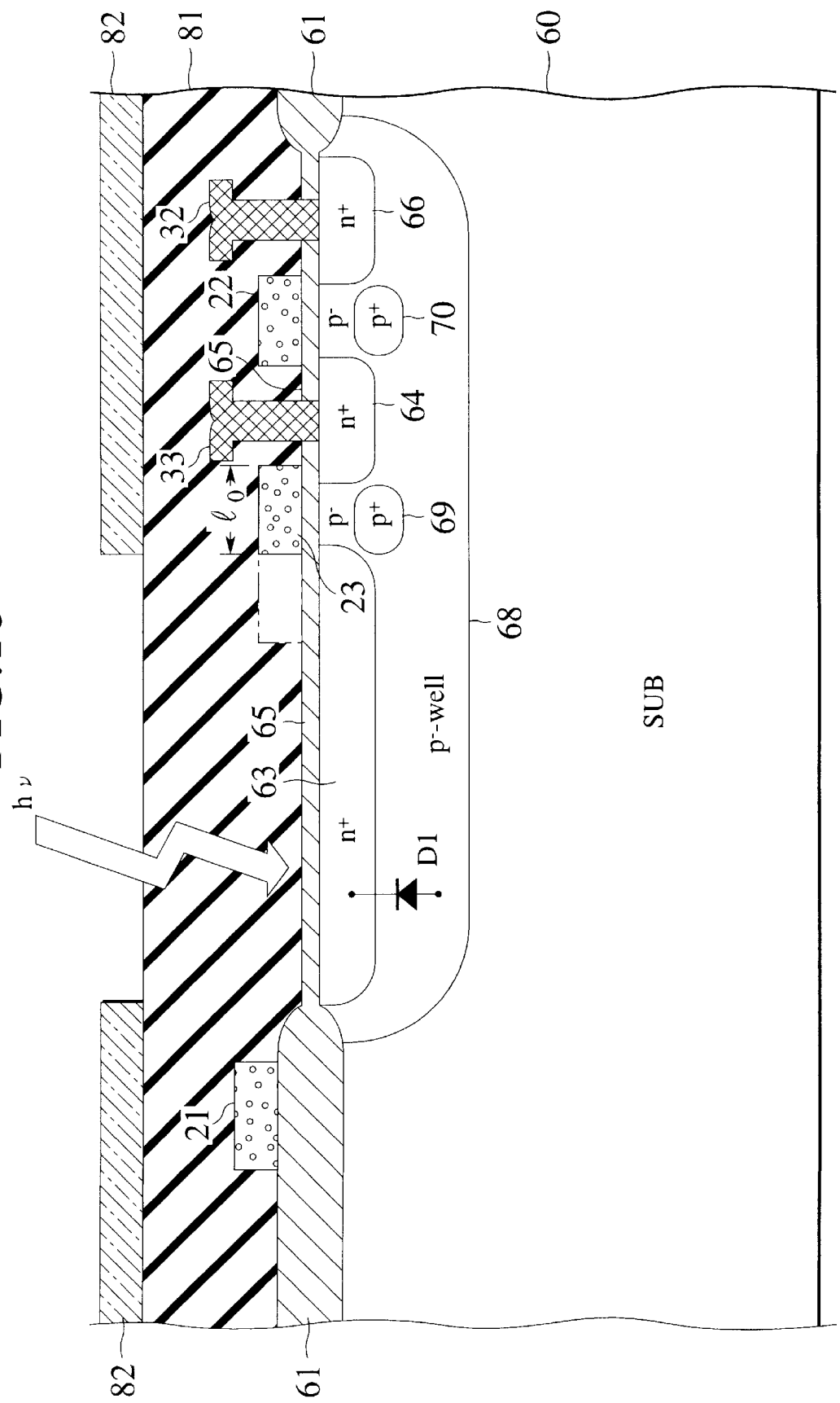
FIG. 16 is a sectional view showing an essential part of a pixel of a MOS type image sensor according to another modification of the third embodiment.

Although FIG. 14 shows the read MOSFET Q2 having the gate electrode 23 of long gate length $l_1$, the gate electrode 23 may have the shorter gate length of $l_0$ as shown in FIGS. 15 and 16. The presence of the p⁺-buried region 69 increases a potential barrier height for electrons of the read MOSFET Q2, to realize a normally OFF characteristic. Accordingly, it is not necessary to elongate the gate length more than required.

FOURTH EMBODIMENT

According to the MOS type image sensors of the first to third embodiments, all the impurity concentrations of the p-well regions 62 (or p⁻-well region 68) and 72 disposed in the image area 901 are lower than that of p-well regions of the peripheral circuitry area 902. However, only the impurity concentration of the p-well region 62 (or p⁻-well region 68) of the image area 901 may be made lower than that of the p-well regions of the peripheral circuitry area 902, while the impurity concentration of the p-well region 72 of the image area 901 is equalized with that of the p-well regions of the peripheral circuitry area 902. This design methodology also realize the effectiveness of the present invention. In FIGS. 5 and 14 to 16, the p-well region 62 (or p⁻-well region 68) contains the read MOSFET Q2 and reset MOSFET Q5. Instead, the MOSFETs Q2 and Q5 may be formed in separate p-well regions having different impurity concentrations, respectively.

For example, design rules are of 0.4 μm, a power supply voltage VDD is 3.0 to 2.8 V, and the thickness of the gate oxide film 65 is 70 nm. In this case, only the gate length of the read MOSFET Q2 is made to 0.7 μm, and the gate length of the other MOSFETs to 0.4 μm. If the power supply voltage VDD is 3.3 V and the thickness of the gate oxide film 65 is 140 nm, the gate length of the read MOSFET Q2 is 0.9 to 1.1 μm, and the gate length of the other MOSFETs is 0.6 to 0.7 μm.

Alternatively, the impurity concentration of the read MOSFET Q2 is $5\times10^{15}$ cm⁻³, and that of the p-well regions of the other MOSFETs is $1\times10^{18}$ cm⁻³.

Figure 17:
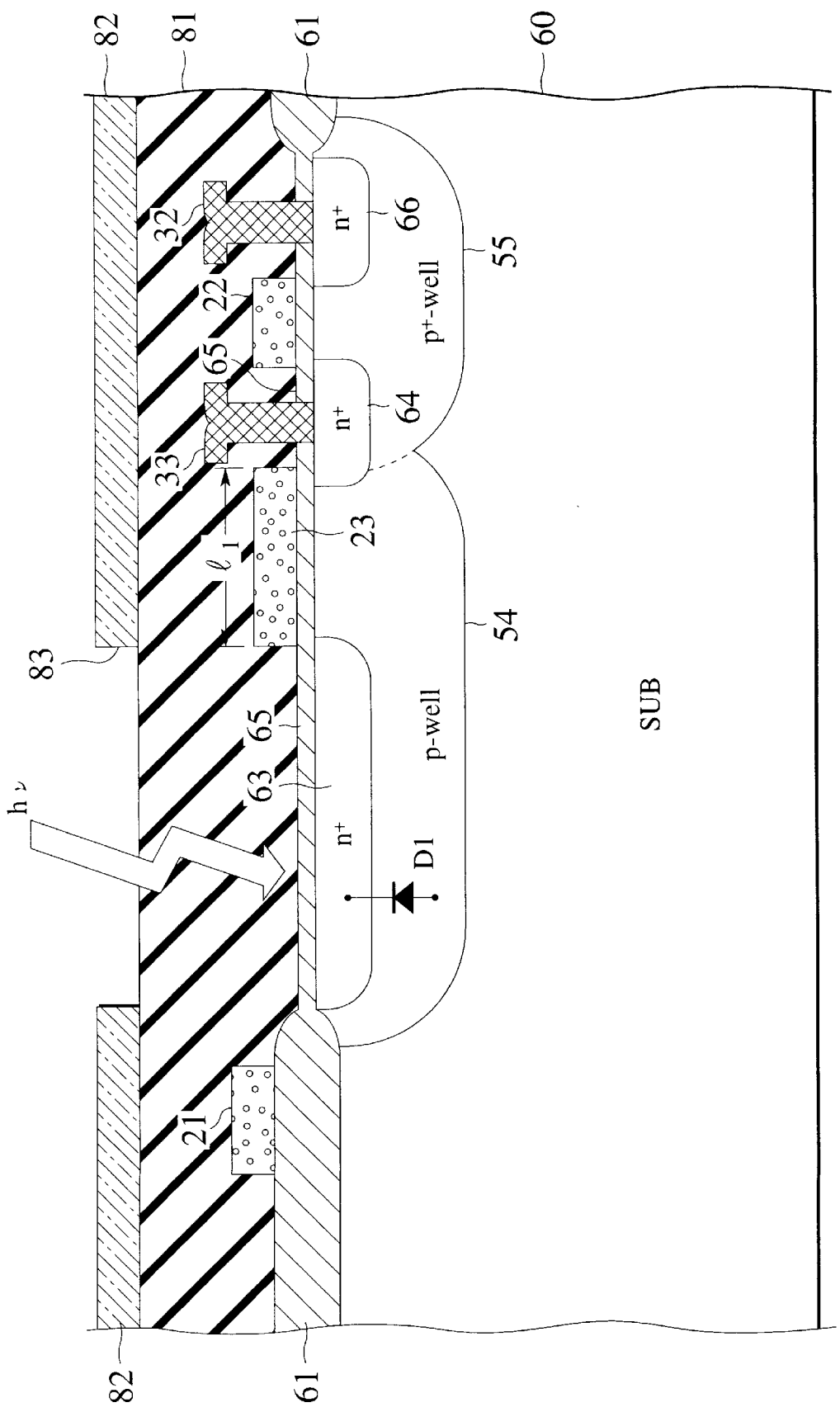
FIG. 17 is a sectional view showing an essential part of a pixel of a MOS type image sensor according to a fourth embodiment of the present invention.

In FIG. 17, the read MOSFET Q2 and reset MOSFET Q5 are formed in a p-well region 54 of low impurity concentration of about $1\times10^{17}$ cm⁻³ and a p⁺-well region 55 of high impurity concentration of about $1\times10^{18}$ cm⁻³. The well regions 54 and 55 are adjacent to each other. This structure corresponds to that of FIG. 5 with the impurity concentration of the p-well region 62 being non-uniform.

Figure 18:
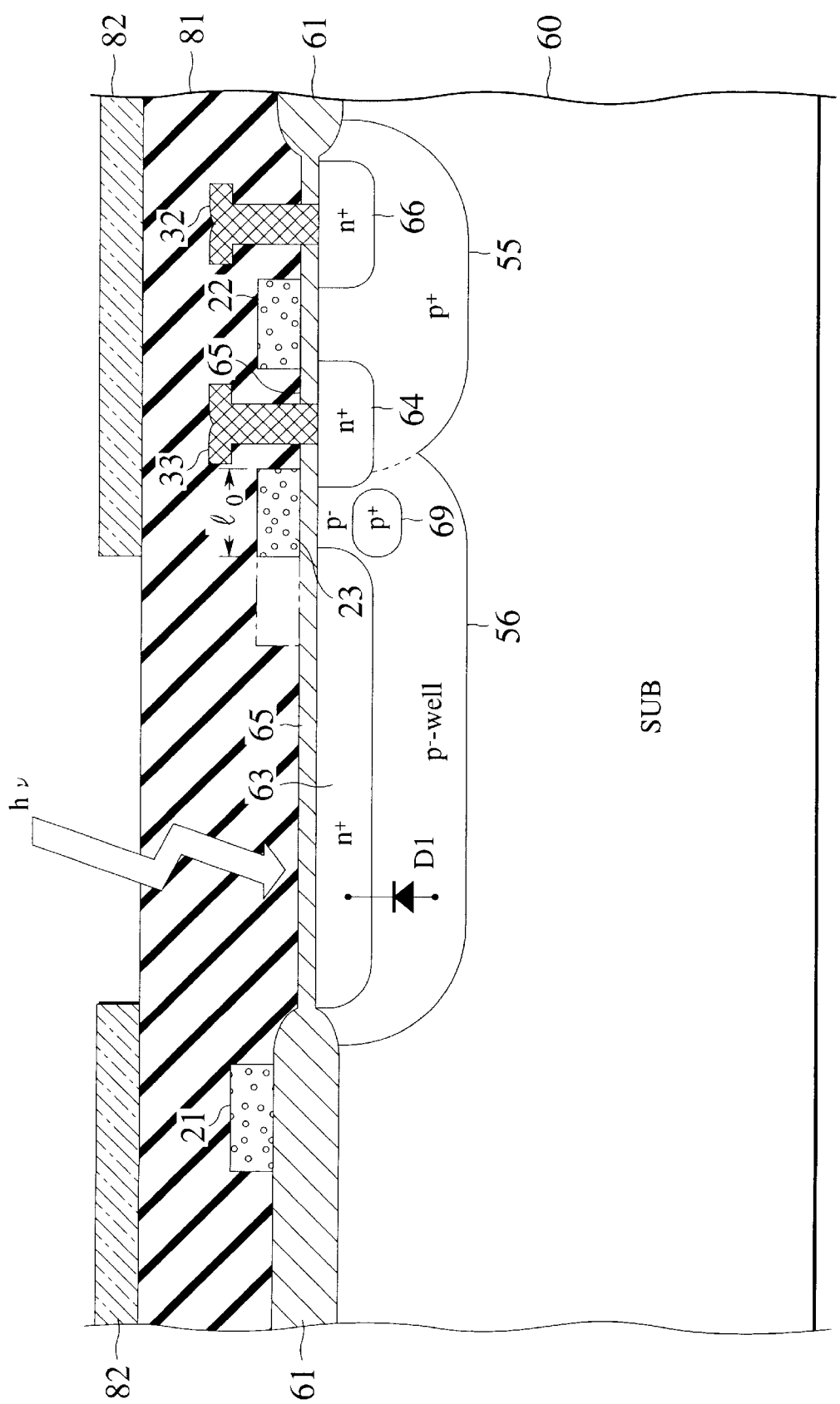
FIG. 18 is a sectional view showing an essential part of a pixel of a MOS type image sensor according to a modification of the fourth embodiment.

Instead, as shown in FIG. 18, the read MOSFET Q2 and reset MOSFET Q5 may be formed in a p⁻well region 56 of low impurity concentration of about $1\times10^{16}$ cm⁻³ and a p⁺-well region 55 of high impurity concentration of about $1\times10^{18}$ cm⁻³. The well regions 56 and 55 are adjacent to each other. This corresponds to FIG. 16 with the impurity concentration of the p⁻well region 68 being non-uniform.

FIFTH EMBODIMENT

In the first to fourth embodiments, the read transistor Q2, amplification transistor Q3, row selection transistor Q4, and reset transistor Q5 of each pixel are MOSFETs. These transistors Q2 to Q5 are not limited to the MOSFETs. All or some of them may be replaced with MOS Static Induction Transistors (SITs).

The MOSSIT can be considered as a transistor that is at an extremity of short channel version of the MOSFET. Namely, the MOSSIT is equivalent to a MOSFET whose source-drain distance is shortened to cause a punch through phenomenon and contains a sharp potential barrier that is controllable by a drain voltage and a gate voltage. More precisely, the height of a saddle point in a two-dimensional potential space, defined by the source-drain potential, as well as the a gate potential of the MOSSIT, is controllable by the drain voltage and the gate voltage thereof. Accordingly, the current-voltage characteristics of the MOSSIT follow exponential function rules like the triode characteristics of vacuum tubes.

Figure 19A:
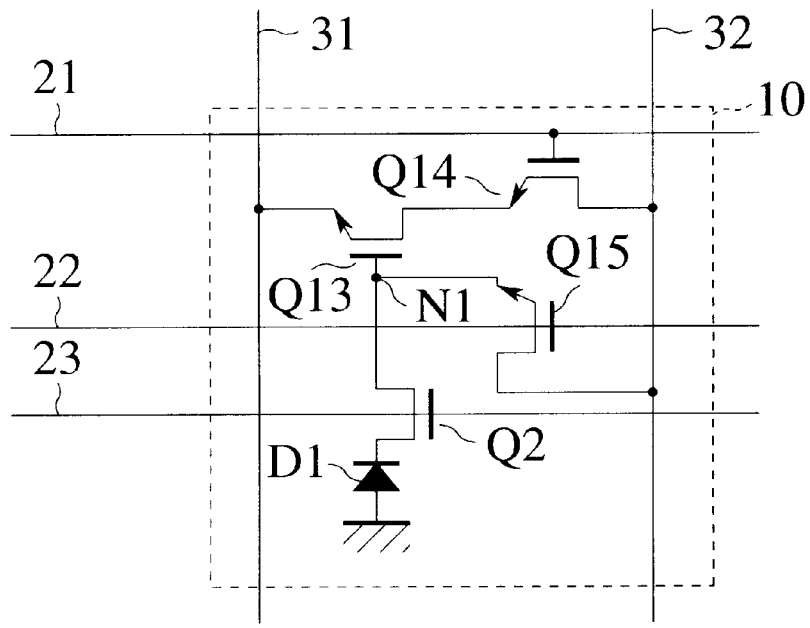
FIG. 19A is a circuit diagram showing a pixel of a MOS type image sensor according to a fifth embodiment of the present invention.

FIG. 19A is a circuit diagram showing a pixel of a MOS type image sensor according to a modification of the fifth embodiment. In the pixel, only a read transistor Q2 is a MOSFET, and the other transistors are MOSSITs. A photodiode D1 serving as a photoelectric converter is connected to the read MOSFET Q2, which is connected to a gate electrode of an amplification MOSSIT Q13. The amplification MOSSIT Q13 is arranged between and connected to a vertical signal line (output signal line) 31 and a row selection MOSSIT Q14. The row selection MOSSIT Q14 is arranged between and connected to a drain line (power supply line) 32 and the amplification MOSSIT Q13. A reset MOSSIT Q15 is arranged between and connected to the drain line (power supply line) 32 and the gate electrode of the amplification MOSSIT Q13.

The structure of the circuit of FIG. 19A resembles that of FIG. 5. If the impurity concentration of the well region 62 is set to be a little lower than $1\times10^{17}$ cm⁻³, the amplification transistor Q3, row selection transistor Q4, and reset transistor Q5 show MOSSIT triode characteristics. If the gate length $l_1$ of the gate electrode 23 of the read transistor Q2 is sufficiently elongated so that negative feedback resistance due to the elongation of the gate length $l_1$ becomes conspicuous between the source and drain regions of the transistor Q2, the read transistor Q2 shows saturated pentode characteristics.

Figure 19B:
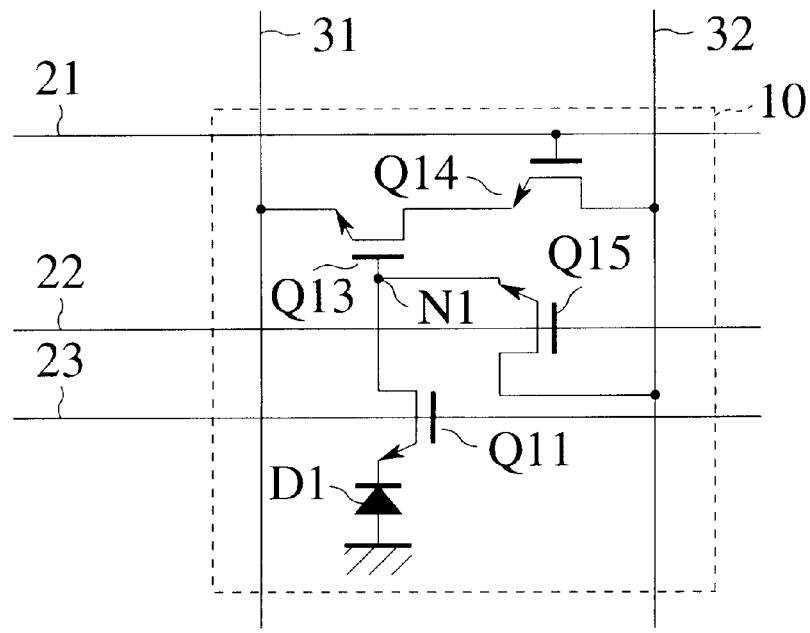
FIG. 19B is a circuit diagram showing a pixel of a MOS type image sensor according to a modification of the fifth embodiment.

FIG. 19B is a circuit diagram showing a pixel of a MOS type image sensor according to a modification of the fifth embodiment. All transistors in the pixel are MOSSITs. A photocliode D1 is connected to a read MOSSIT Q11, which is connected to the gate electrode of an amplification MOSSIT Q13. The amplification MOSSIT Q13 is arranged between and connected to a vertical signal line (output signal line) 31 and a row selection MOSSIT Q14. The row selection MOSSIT Q14 is arranged between and connected to a drain line (power supply line) 32 and the amplification MOSSIT Q13. A reset MOSSIT Q15 is arranged between and connected to the drain line (power supply line) 32 and the gate electrode of the amplification MOSSIT Q13.

The structure of the circuit of FIG. 19B resembles the structure of FIGS. 11 and 12. If the impurity concentration of the well region 62 is set to be a little farther below $1 \times 10^{17}$ $cm^{-3}$, the amplification transistor Q3, row selection transistor Q4, and reset transistor Q5 show MOSSIT triode characteristics. With these low impurity concentration, if the height of a potential barrier just under the gate electrode 23 of the read transistor Q2 is made to be controllable by a drain voltage and gate voltage, the read transistor Q2 shows unsaturated triode characteristics.

Figure 19C:
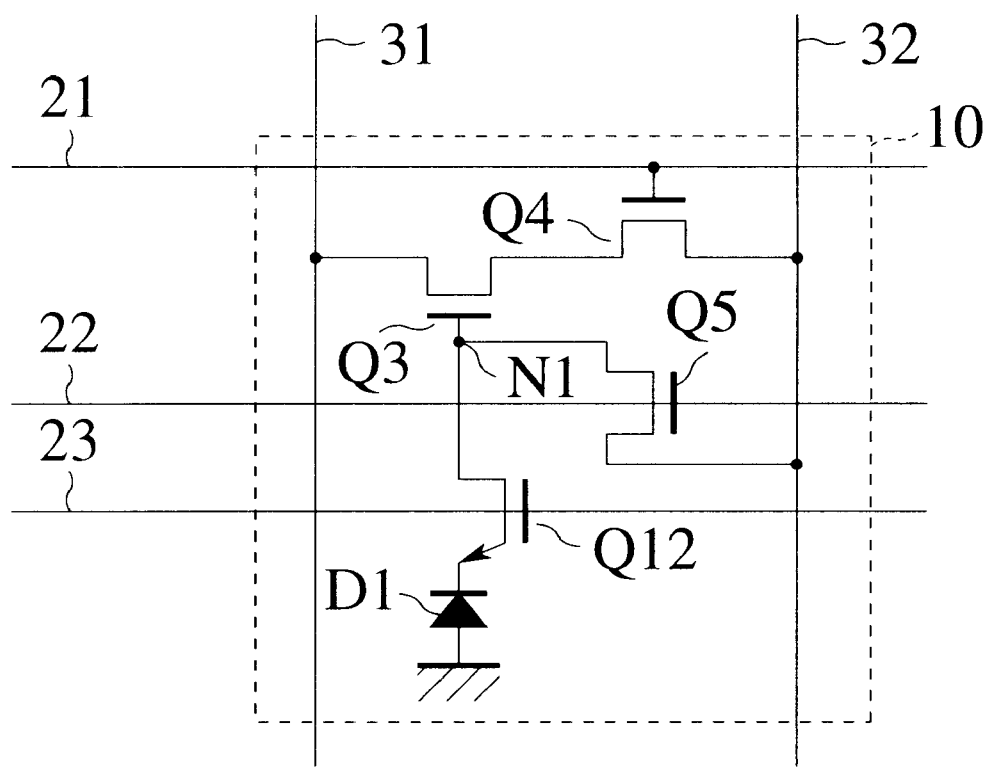
FIG. 19C is a circuit diagram showing a pixel of a MOS type image sensor according to another modification of the fifth embodiment.

FIG. 19C is a circuit diagram showing a pixel of a MOS type image sensor according to another modification of the fifth embodiment. The pixel has a read MOSSIT Q12. Other transistors of the pixel, i.e., an amplification transistor Q3, row selection transistor Q4, and reset transistor Q5 are MOSFETs. A photodiode D1 is connected to the read MOSSIT Q12, which is connected to a gate electrode of the amplification MOSFET Q3. The amplification MOSFET Q3 is arranged between and connected to a vertical signal line (output signal line) 31 and the row selection MOSFET Q4. The row selection MOSFET Q4 is arranged between and connected to the drain line (power supply line) 32 and the amplification MOSFET Q3. The reset MOSFET Q5 is arranged between end connected to the drain line (power supply line) 32 and a gate electrode of the amplification MOSFET Q3.

The structure of the circuit of FIG. 19C resembles the structure of FIGS. 11 and 12. If the impurity concentration of the well region 62 is set to be about $2 \times 10^{17}$ $cm^{-3}$ or above, the amplification transistor Q3, row selection transistor Q4, and reset transistor Q5 show MOSFET pentode characteristics. The low impurity concentration region 51 (52, 53) of about $1 \times 10^{11}$ $cm^{-3}$ to $1 \times 10^{14}$ $cm^{-3}$ is formed around the source region 63 of the read transistor Q12, i.e., the cathode region of the photodiode D1. The height of a potential barrier just under the gate electrode 23 of the read transistor Q12 is controlled by a drain voltage and gate voltage, so that the read transistor Q12 shows unsaturated triode characteristics.

SIXTH EMBODIMENT

According to the first to fifth embodiments, each pixel consists of the read MOSFET Q2, amplification MOSFET Q3, row selection MOSFET Q4, and reset MOSFET Q5. The reset MOSFET Q5 may be omitted as shown in FIG. 20A when forming a pixel of a MOS type image sensor according to the present invention.

The reset MOSFET Q5 has a function of maintaining the potential of the gate of the amplification MOSFET Q3 at a constant level, and therefore, is effective to remove variations among pixels of the MOS type image sensor. If the reset MOSFET Q5 is omitted as shown in FIG. 20A, the structure of each pixel becomes simpler, to miniaturize the pixel size, improving the integration density of the MOS type image sensor.

Figure 20A:
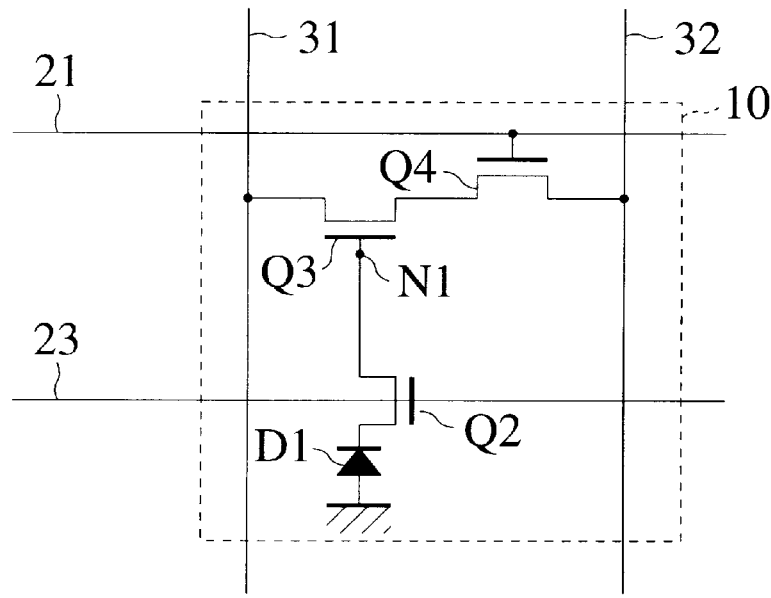
FIG. 20A is a circuit diagram showing a pixel of a MOS type image sensor according to a sixth embodiment of the present invention.
Figure 20B:
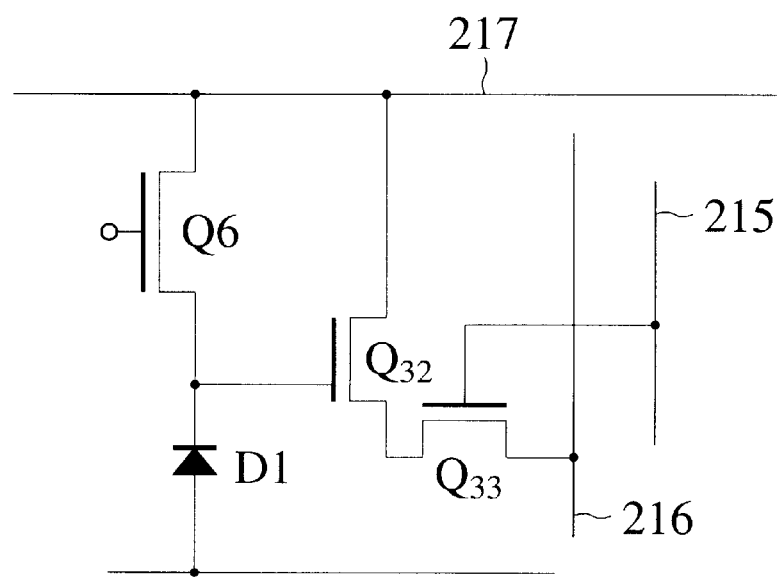
FIG. 20B is a circuit diagram showing a pixel of a MOS type image sensor according to a modification of the sixth embodiment.

In FIG. 20B, a photodiode D1 is connected to a source electrode of a load MOSFET Q6 serving as the read MOSFET and a gate electrode of an amplification MOSFET Q32. A drain electrode of the amplification MOSFET Q32 is connected to a source electrode of a row selection MOSFET Q33. A gate electrode of the row selection MOSFET Q33 is connected to an activation line 215, and a drain electrode thereof is connected to a data read line 216. A drain electrode of the read MOSFET (load MOSFET) Q6 and a source electrode of the amplification MOSFET Q32 are connected to an output signal line 217. The amplification MOSFET Q32 works as a source follower.

In the three-transistor structures of FIGS. 20A and 20B, the impurity concentration of a p-well region of each pixel is made lower than that of a p-well region of the peripheral circuitry area around the image area, to improve light sensitivity even if the image sensor employs finer and finer MOSFETs, as mentioned in the first embodiment. In particular, this technique is advantageous in improving spectral sensitivity in a long wavelength spectrum, preventing "white pixels" due to junction leakage currents, and lowering a signal read voltage.

FIG. 21 is a sectional view showing the read MOSFET Q2 of FIG. 20A. A sectional view of the load MOSFET Q6 of FIG. 20B is the same as FIG. 21. In FIG. 21, a p-substrate 60 has a principal surface where a field oxide film 61 is formed to define an active area. At a principal surface of and in the active area, a p-well region 57 is formed. At a part of the surface of and in the p-well region 57, there is formed a first diffusion layer (n-diffusion layer) 63, to serve as a cathode region of a photodiode D1. The n-diffusion layer 63 also serves as a source region of the read MOSFET Q2. At another part of the surface of and in the p-well region 57, there is formed a second diffusion layer (n-diffusion layer) 64 serving as a drain region of the read MOSFET Q2. The active area is covered with a gate insulation film 65, on which a gate electrode 23 of the read MOSFET Q2 is formed. The gate electrode 23 serves as a signal line 23 and forms a wiring layer that extends vertically. The n-diffusion layer 64 is connected to a metal wire 33 that extends to a gate electrode of the amplification MOSFET Q3. In the case of the load MOSFET Q6 of FIG. 20B, the output signal line 217 should be connected to the n-diffusion layer 64 instead of the metal wire 33. On these elements, an interlayer insulation film 81 is formed, and a light shielding film 82 is formed on the film 81. The light shielding film 82 has a light aperture 83 above the photodiode D1.

Figure 22:
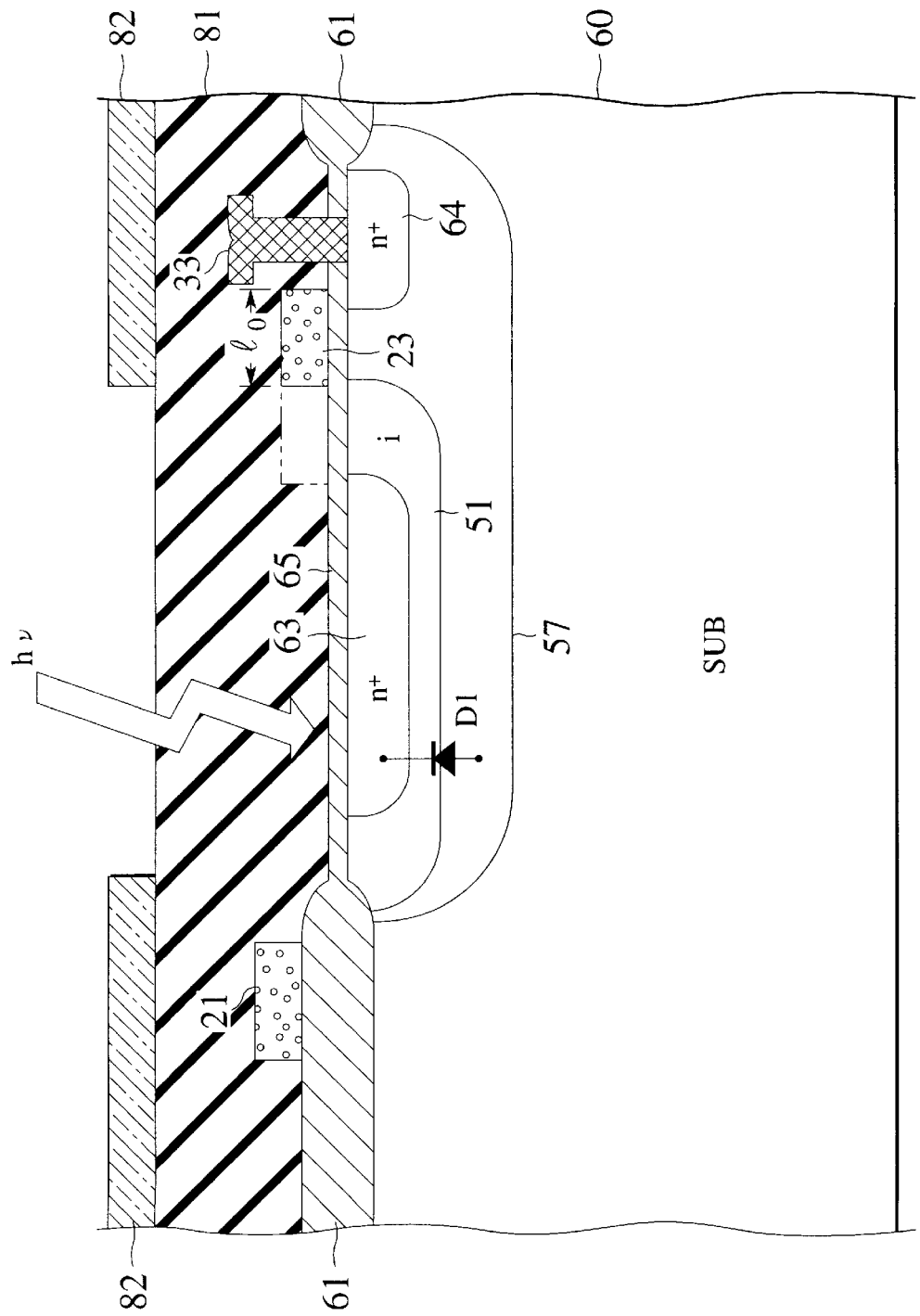
FIG. 22 is a sectional view showing another example of the structure of the read MOSFET of FIG. 20A.

FIG. 22 is a sectional view showing another example of the structure of the read MOSFET Q2 of FIG. 20A. FIG. 22 is also applicable to the load MOSFET Q6 of FIG. 20B. In FIG. 22, a p-substrate 60 has a principal surface on which a field oxide film 61 is formed to define an active area. At a principal surface of and in the active area, a p-well region 57 is formed. At a part of the surface of and in the p-well region 57, there is formed an intrinsic semiconductor region 51. The intrinsic semiconductor region 51 contains and adjoins the first diffusion layer (n-diffusion layer) 63 serving as a cathode region of a photodiode D1. Namely, the n-diffusion layer 63, intrinsic semiconductor region 51, and p-well region 57 form the nip photodiode D1. The n-diffusion layer 63 also serves as a source region of the read MOSFET Q2.

At another part of the surface of and in the p-well region 57, there is formed a second diffusion layer (n-diffusion layer) 64 serving as a drain region of the read MOSFET Q2. The surface of the active area is covered with a gate insulation film 65 on which a gate electrode 23 of the read MOSFET Q2 having a gate length of $l_0$ is formed. The gate electrode 23 serves as a signal line 23 and forms a wiring layer extending vertically with respect lo the plane of the drawing. The n-diffusion layer 64 is connected to a metal wire 33 that extends to a gate electrode of the amplification MOSFET Q3. In the case of the load MOSFET Q6 of FIG. 20B, there should be the output signal line 217 connected to the n-diffusion layer 64, instead of the metal wire 33. An interlayer insulation film 81 is formed on these elements, and a light shielding film 82 is formed on the insulation film 81. The light shielding film 82 has a light aperture 83 above the photodiode D1.

Figure 23:
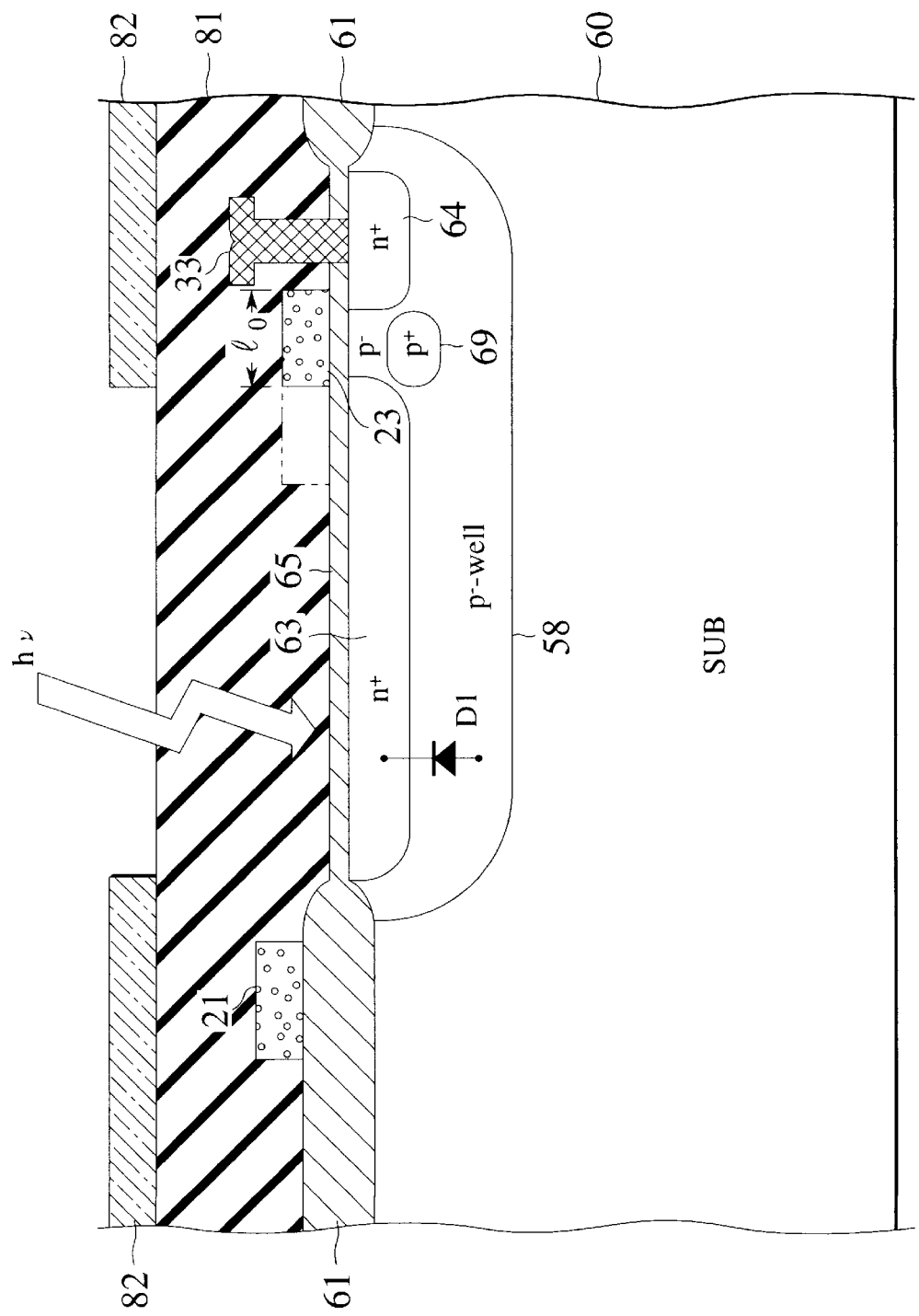
FIG. 23 is a sectional view showing still another example of the structure of the read MOSFET of FIG. 20A.

FIG. 23 is a sectional view showing still another example of the structure of the read MOSFET Q2 of FIG. 20A. The load MOSFET Q6 of FIG. 20B has the same sectional view as FIG. 23. In FIG. 23, a p-substrate 60 has a principal surface on which a field oxide film 61 is formed to define an active area. On the principal surface of the p-substrate 60 in the active area, a p⁻-well region 58 of $2 \times 10^{16}$ cm⁻³ to $1 \times 10^{17}$ cm⁻³ in impurity concentration is formed. At a part of the surface of the p⁻-well region 58, there is formed a first diffusion layer (n-diffusion layer) 63 serving as a cathode region of a photodiode D1. Namely, the n-diffusion layer 63 and p⁻-well region 58 form the pn photodiode D1. The n-diffusion layer 63 also serves as a source region of a read MOSFET Q2. At another part of the surface of the p⁻-well region 58, there is formed a second diffusion layer (n-diffusion layer) 64 serving as a drain region of the read MOSFET Q2. Between the source and drain regions of the read MOSFET Q2, there is formed a p⁺-buried region 69 of $2 \times 10^{18}$ cm⁻³ to $8 \times 10^{19}$ cm⁻³ in impurity concentration. The surface of the active area is covered with a gate insulation film 65 on which a gate electrode 23 of the read MOSFET Q2 having a gate length of $l_0$ is formed. Just under the gate electrode 23 of the read MOSFET Q2, there is the top layer of the p⁻-well region 58 serving as a channel region, and under which, there is the p⁺-buried region 69. This arrangement increases a potential barrier height for electrons in the channel region just under the gate electrode 23, to realize normally OFF characteristics. The gate electrode 23 serves as a signal line 23 and forms a wiring layer that extends vertically to the plane of the drawing. The n-diffusion layer 64 is connected to a metal wire 33 (FIG. 10) that extends to the gate electrode (node N1) of the amplification MOSFET Q3. In the case of the load MOSFET Q6 of FIG. 20B, the metal wire 33 should be replaced with the output signal line 217. An interlayer insulation film 81 is formed on these elements, and a light shielding film 82 is formed on the insulation film 81. The light shielding film 82 has a light aperture 83 above the photodiode D1.

In FIGS. 20A and 20B, the transistors Q2, Q3, Q4, Q6, Q32, and Q33 are not necessarily MOSFETs. All or part of them may be replaced with MOSSITs.

Figure 24A:
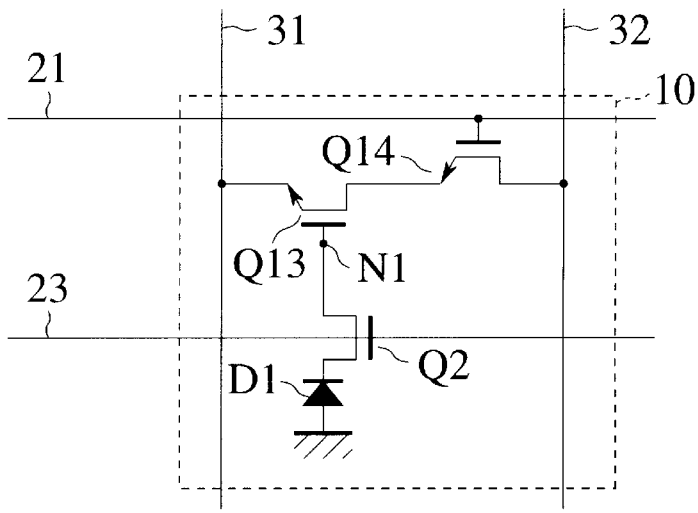
FIG. 24A is a circuit diagram showing a pixel of a MOS type image sensor according to another modification of the sixth embodiment.

FIG. 24A is a circuit diagram showing a pixel of a MOS type image sensor according to another modification of the sixth embodiment. Only a read transistor Q2 is a MOSFET, and other transistors are MOSSITs. A photodiode D1 serving as a photoelectric converter is connected to the read MOSFET Q2, which is connected to a gate electrode of an amplification MOSSIT Q13. The amplification MOSSIT Q13 is arranged between and connected to a vertical signal line (output signal line) 31 and a row selection MOSSIT Q14. The row selection MOSSIT Q14 is arranged between and connected to a drain line (power supply line) 32 and the amplification MOSSIT Q13.

The pixel structure of FIG. 24A lowers the impurity concentration of the well region of the amplification transistor Q13 and row selection transistor Q14 below $1 \times 10^{17}$ cm⁻³, to realize MOSSIT triode characteristics. However, the impurity concentration of the p-well region 57 of the read transistor Q2 is set to be about $1 \times 10^{17}$ cm⁻³, and the gate length $l_1$ of the gate electrode 23 of the read transistor Q2 is sufficiently long as shown in FIG. 21, to realize saturated pentode characteristics.

Figure 24B:
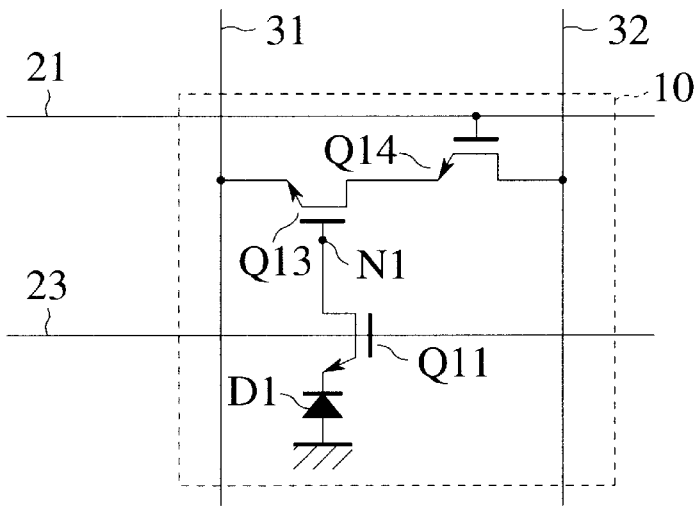
FIG. 24B is a circuit diagram showing a pixel of a MOS type image sensor according to still another modification of the sixth embodiment.

FIG. 24B is a circuit diagram showing a pixel of a MOS type image sensor according to still another modification of the sixth embodiment. All transistors of the pixel are MOSSITs. A photodiode D1 is connected to the read MOSSIT Q11, which is connected to a gate electrode of the amplification MOSSIT Q13. The amplification MOSSIT Q13 is arranged between and connected to a vertical signal line (output signal line) 31 and the row selection MOSSIT Q14. The row selection MOSSIT Q14 is arranged between and connected to a drain line (power supply line) 32 and the amplification MOSSIT Q13.

The structure of the read MOSSIT Q11 employed in the circuit of FIG. 24B is shown in FIG. 22. The well regions that form the read transistor Q11, amplification transistor Q13, and row selection transistor Q14 employed in the circuit of FIG. 24B have an impurity concentration lower than $1 \times 10^{17}$ cm⁻³. Then, the amplification transistor Q13 and row selection transistor Q14 realize MOSSIT triode characteristics. The height of a potential barrier just under the gate electrode 23 of the read transistor Q11 is controlled by a drain voltage and a gate voltage, so that the read transistor Q11 may show unsaturated triode characteristics.

Figure 24C:
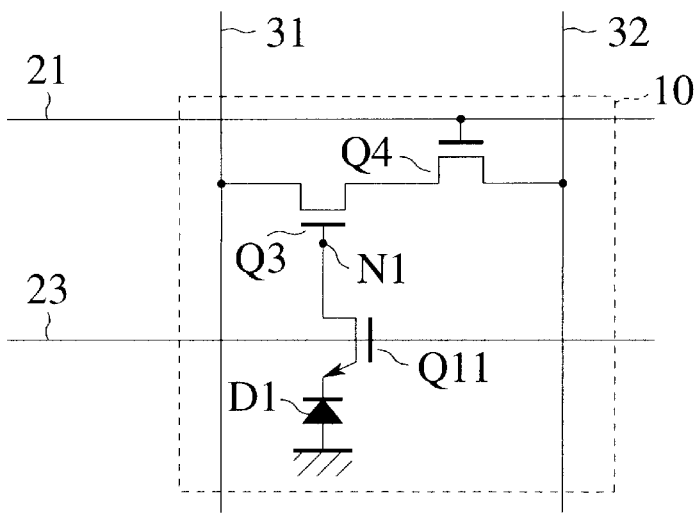
FIG. 24C is a circuit diagram showing a pixel of a MOS type image sensor according to still another modification of the sixth embodiment.

FIG. 24C is a circuit diagram showing a pixel of a MOS type image sensor according to still another modification of the sixth embodiment. Each pixel consists of a read MOSSIT Q11, an amplification MOSFET Q3, and a row selection MOSFET Q4. A photodiode D1 is connected to the read MOSSIT Q11, which is connected to a gate electrode of the amplification MOSFET Q3. The amplification MOSFET Q3 is arranged between and connected to a vertical signal line (output signal line) 31 and the row selection MOSFET Q4. The row selection MOSFET Q4 is arranged between and connected to a drain line (power supply line) 32 and the amplification MOSFET Q3.

The structure of the read MOSSIT Q11 employed in the circuit of FIG. 24C is shown in FIG. 22. The impurity concentration of each well region employed in the circuit of FIG. 24C is set to be higher than $2 \times 10^{17}$ cm⁻³ so that the amplification transistor Q3 and row selection transistor Q4 may show MOSFET pentode characteristics. As shown in FIG. 22, a low-impurity region 51 of $1 \times 10^{11}$ cm⁻³ to $1 \times 10^{14}$ cm⁻³ is formed around the source region 63 of the read MOSSIT Q11, i.e., the cathode region of the photodiode D1. The height of a potential barrier just under the gate electrode 23 of the read. MOSSIT Q11 is controlled by a drain voltage and a gate voltage, so that the read MOSSIT Q11 may show unsaturated triode characteristics.

OTHER EMBODIMENTS

Various modifications will become possible for those skilled in the art after receiving the teachings of the present disclosure without departing from the scope thereof.

The substrates of the first to sixth embodiments are not necessarily p-substrates. The present invention is achievable with p-well regions formed in an n-substrate. In this case, it is preferable to form a contact region at a part of each p-well region to supply ground level or fixed potential to prevent the p-well region from becoming the floating state. The reset transistor (Q5) is not limited to a MOSFET or a MOSSIT. It may be a junction FET or a junction SIT, a Schottky FET or a Schottky SIT, or a bipolar transistor (BJT). The device for activating the source follower circuit is not limited to a MOSFET or MOSSIT. It may be a capacitor coupled with an input gate.

In the first to sixth embodiments, the field oxide film 61 for isolation region is formed by LOCOS method. For a MOS type image sensor employing finer elements with a gate length of $l_0=0.4$ μm or shorter, the field oxide film 61 may be a buried oxide film formed by, for example, shallow trench isolation (STI) method.

In the first to sixth embodiments, the read transistor Q2, Q6, Q11, Q12 amplification transistor Q3, Q13, Q32, row selection transistor Q4, Q14, Q33, and reset transistor Q5, Q15 of each pixel are explained as n-channel IGTs. These transistors Q2–Q6, Q11–Q15, Q32 and Q33 are not limited to the n-channel IGTs. That is, p-channel MOSFETs or p-channel MOSSITs are employable for the read transistor, amplification transistor, row selection transistor, and reset transistor, each formed in n-well regions. In this case, a p-diffusion layer serving as an anode region of the photodiode is formed at the surface of and in the n-well region serving as a cathode region of the photodiode.

In this way, the present invention is achievable in various ways. Accordingly, the technical scope of the present invention is defined only by appended claims.

What is claimed is:

1. A MOS type image sensor having an image area containing an array of pixels and a peripheral circuitry area having a peripheral circuit disposed in a first well region of a first conductivity type for driving the image area, each pixel comprising:
   (a) a second well region of the first conductivity type, having a lower impurity concentration than the first well region;
   (b) a photodiode having:
      a first main electrode region made of the second well region; and
      a second main electrode region formed as a first diffusion layer of a second conductivity type opposite to the first conductivity type, disposed at a part of the surface of and in the second well region;
   (c) a read transistor having:
      a first main electrode region made of the first diffusion layer;
      a second main electrode region formed as a second diffusion layer of the second conductivity type disposed at a part of the surface of and in the second well region;
      a gate insulation film disposed on the surface of the second well region between the first and second diffusion layers; and
      a gate electrode disposed on the gate insulation film and connected to a read signal line; and
   (d) an amplification transistor disposed in a third well region of the first conductivity type, having:
      a gate electrode connected to the second main electrode region of the read transistor;
      a first main electrode region connected to an output signal line; and
      a second main electrode region.

2. The image sensor of claim 1, further comprising a semiconductor region disposed around and adjacent to the first diffusion layer, being sandwiched between the first diffusion layer and the second well region, the semiconductor region having a lower impurity concentration than the second well region.

3. The image sensor of claim 1, further comprising a buried region of the first conductivity type disposed between the first and second diffusion layers away from the surfaces of the second well region, having a higher impurity concentration than the second well region.

4. The image sensor of claim 1, wherein the gate length of the read transistor is equal to that of a transistor disposed in the first well region.

5. The image sensor of claim 1, wherein the gate length of the read transistor is longer than that of a transistor disposed in the first well region.

6. The image sensor of claim 2, wherein the gate length of the read transistor is equal to that of a transistor disposed in the first well region.

7. The image sensor of claim 3, wherein the gate length of the read transistor is equal to that of a transistor disposed in the first well region.

8. The image sensor of claim 1, further comprising a row selection transistor having:
   a first main electrode region connected to the second main electrode region of the amplification transistor;
   a gate electrode connected to a row select signal line; and
   a second main electrode region connected to a power supply line.

9. The image sensor of claim 8, further comprising a reset transistor having:
   a first main electrode region connected to the gate electrode of the amplification transistor;
   a gate electrode connected to a reset signal line; and
   a second main electrode region connected to the power supply line.

10. The image sensor of claim 1, wherein the impurity concentration of the third well region is equal to that of the first well region.

11. The image sensor of claim 1, wherein the impurity concentration of the third well region is lower than that of the first well region.

12. The image sensor of claim 1, wherein the reset transistor is disposed in the second well region with the second diffusion layer serving as the first main electrode region of the reset transistor.

13. The image sensor of claim 1, wherein the reset transistor is disposed in a fourth well region of the first conductivity type.

14. The image sensor of claim 13, wherein the impurity concentration of the fourth well region is equal to that of the first well region.

15. The image sensor of claim 8, wherein the read transistor, amplification transistor, and row selection transistor are each a MOSFET.

16. The image sensor of claim 8, wherein the read transistor is a MOSFET, and the amplification transistor and row selection transistor are each a MOSSIT.

17. A MOS type image sensor having an image area containing an array of pixels, each pixel comprising:
   (a) a photodiode having:
      a first main electrode region made of a well region of a first conductivity type;
      a second main electrode region formed as a first diffusion layer of a second conductivity type opposite to the first conductivity type, disposed at a part of the surface of and in the well region; and a semiconductor region that surrounds the first diffusion layer, being sandwiched between the first diffusion layer and the well region, having a lower impurity concentration than the well region;

(b) a read transistor having:
a first main electrode region made of the first diffusion layer;
a second main electrode region formed as a second diffusion layer of the second conductivity type disposed at a part of the surface of and in the well region;
a gate insulation film disposed on the surface of the well region between the first and second diffusion layers; and
a gate electrode disposed on the gate insulation film and connected to a read signal line; and (c) an amplification transistor having:
a gate electrode connected to the second main electrode region of the read transistor;
a first main electrode region connected to an output signal line; and
a second main electrode region.

18. The image sensor of claim 17, further comprising a row selection transistor having:
a first main electrode region connected to the second main electrode region of the amplification transistor;
a gate electrode connected to a row select signal line; and
a second main electrode region connected to a power supply line.

19. The image sensor of claim 18, further comprising a reset transistor having:
a first main electrode region connected to the gate electrode of the amplification transistor;
a gate electrode connected to a reset signal line; and
a second main electrode region connected to the power supply line.

20. The image sensor of claim 19, wherein the reset transistor is disposed in the well region with the second diffusion layer serving as the first main electrode region of the reset transistor.

21. A MOS type image sensor having an image area containing an array of pixels and a peripheral circuitry area having a peripheral circuit disposed in a first well region of a first conductivity type for driving the image area, each pixel comprising:

(a) a second well region of the first conductivity type, having a lower impurity concentration than the first well region;

(b) a photodiode having:
a first main electrode region made of the second well region; and
a second main electrode region formed as a first diffusion layer of a second conductivity type opposite to the first conductivity type, disposed at a part of the surface of and in the second well region;

(c) a read transistor having:
a first main electrode region made of the first diffusion layer;
a second main electrode region formed as a second diffusion layer of the second conductivity type disposed at a part of the surface of and in the second well region;
a gate insulation film disposed on the surface of the second well region between the first and second diffusion layers; and
a gate electrode disposed on the gate insulation film;

(d) an amplification transistor disposed in a third well region of the first conductivity type, having:
a gate electrode connected to the first main electrode region of the read transistor;
a first main electrode region connected to an output signal line; and
a second main electrode region; and (e) a row selection transistor disposed in the third well region and having:
a first main electrode region connected to the second main electrode region of the amplification transistor;
a gate electrode connected to an activation signal line; and
a second main electrode region connected to a data read signal line.

22. The image sensor of claim 21, further comprising a semiconductor region disposed around and adjacent to the first diffusion layer, being sandwiched between the first diffusion layer and the second well region, the semiconductor region having a lower impurity concentration than the second well region.

23. The image sensor of claim 21, further comprising a buried region of the first conductivity type disposed between the first and second diffusion layers away from the surface of the second well region, having a higher impurity concentration than the second well region.

24. The image sensor of claim 21, wherein the gate length of the read transistor is equal to that of a transistor disposed in the first well region.

25. The image sensor of claim 21, wherein the gate length of the read transistor is longer than that of a transistor disposed in the first well region.

26. The image sensor of claim 21, wherein the impurity concentration of the third well region is equal to that of the first well region.

27. The image sensor of claim 21, wherein the impurity concentration of the third well region is lower than that of the first well region.

* * * * *